United States Patent
Bessler

(10) Patent No.: US 12,372,581 B2
(45) Date of Patent: Jul. 29, 2025

(54) METHOD AND DEVICE FOR DETERMINING THE STATE OF CHARGE AND THE STATE OF HEALTH OF A RECHARGEABLE BATTERY

(71) Applicant: Benning CMS Technology GmbH, March (DE)

(72) Inventor: Wolfgang Bessler, Offenburg (DE)

(73) Assignee: Benning CMS Technology GmbH, March (DE)

( * ) Notice: Subject to any disclaimer, the term of this patent is extended or adjusted under 35 U.S.C. 154(b) by 0 days.

(21) Appl. No.: 17/768,468

(22) PCT Filed: Oct. 14, 2020

(86) PCT No.: PCT/DE2020/100887
§ 371 (c)(1),
(2) Date: Apr. 13, 2022

(87) PCT Pub. No.: WO2021/073690
PCT Pub. Date: Apr. 22, 2021

(65) Prior Publication Data
US 2024/0295605 A1    Sep. 5, 2024

(30) Foreign Application Priority Data
Oct. 15, 2019 (DE) .......................... 102019127828.7

(51) Int. Cl.
*G06F 11/30* (2006.01)
*G01R 31/367* (2019.01)
(Continued)

(52) U.S. Cl.
CPC ......... *G01R 31/367* (2019.01); *G01R 31/374* (2019.01); *G01R 31/3835* (2019.01); *G01R 31/392* (2019.01)

(58) Field of Classification Search
CPC .................................................... G01R 31/367
See application file for complete search history.

(56) References Cited

U.S. PATENT DOCUMENTS

| | | | |
|---|---|---|---|
| 5,381,096 | A | 1/1995 | Hirzel |
| 2004/0212367 | A1 | 10/2004 | Dougherty |

(Continued)

FOREIGN PATENT DOCUMENTS

| | | |
|---|---|---|
| EP | 3 174 175 A1 | 5/2017 |
| JP | 2014-074682 A | 4/2014 |

(Continued)

OTHER PUBLICATIONS

Japanese Patent Office Action issued Apr. 19, 2023 in Japanese patent application No. 2022-522068.

*Primary Examiner* — Phuong Huynh
(74) *Attorney, Agent, or Firm* — Calvert Technology Law, PLLC; Nathan H. Calvert

(57) ABSTRACT

The invention relates to a method and a device for determining the state of charge (SOC) of a rechargeable battery (106) of a specified battery type, or a parameter physically related thereto, in particular a remaining charge amount Q contained in the battery, wherein the method operates by means of a voltage-controlled battery model (102), which is parameterized for the battery (106) in question or a corresponding battery type. It is merely necessary to measure the battery voltage $U_{mess}$ and to provide it to the battery model (102) as an input variable. The invention further relates to a method and a device for determining the state of health (SOH) of a battery (102), wherein the battery model (102), which is also used to determine the SOC, provides a modelled battery current $I_{mod}$. Modelled charge amounts during charging and discharging phases of the battery (106) can be determined therefrom and compared with measured charge amounts, which are determined from the measured (Continued)

Figure 1:
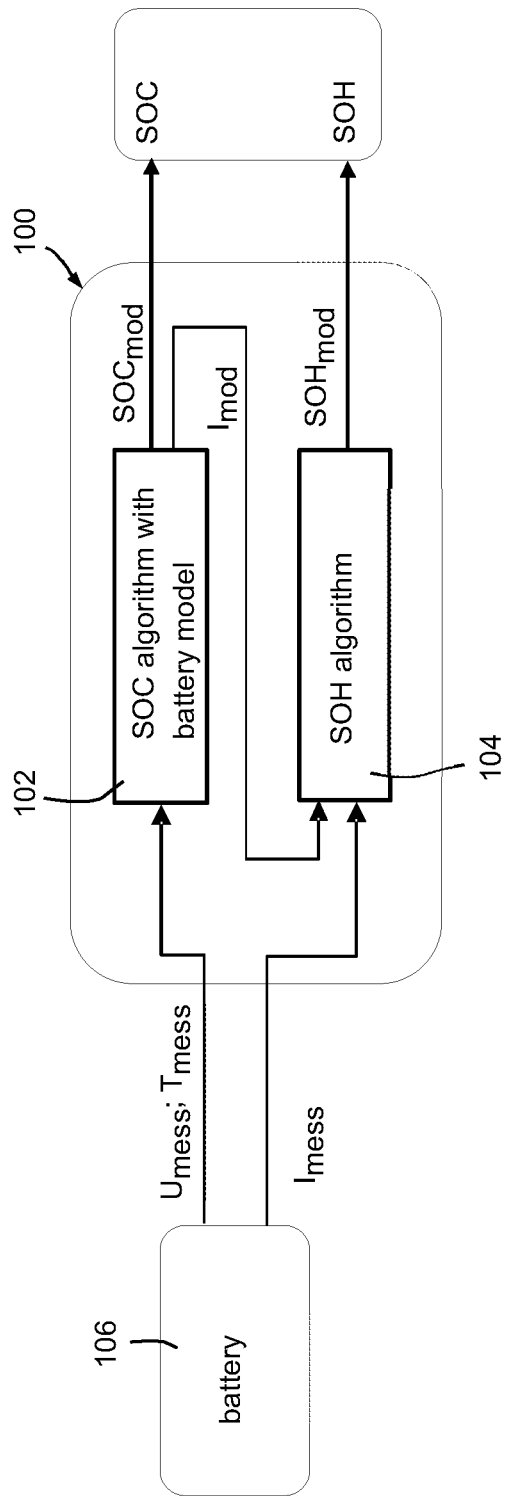

battery current $I_{meas}$. Because the battery model (102) does not age, the SOH of the battery can thereby be determined.

18 Claims, 10 Drawing Sheets

(51) Int. Cl.
    *G01R 31/374*     (2019.01)
    *G01R 31/3835*     (2019.01)
    *G01R 31/392*     (2019.01)

(56) References Cited

U.S. PATENT DOCUMENTS

| | | |
|---|---|---|
| 2011/0093223 A1 | 4/2011 | Quet |
| 2013/0271065 A1 | 10/2013 | Chou |
| 2014/0049226 A1 | 7/2014 | Driemeyer-Franco |
| 2014/0203813 A1* | 7/2014 | Driemeyer-Franco .............. G01R 31/367 324/434 |
| 2016/0209472 A1 | 7/2016 | Chow |
| 2019/0170827 A1* | 6/2019 | Shoa Hassani Lashidani ............ G01R 31/392 |

FOREIGN PATENT DOCUMENTS

| | | |
|---|---|---|
| JP | 2014-520254 A | 8/2014 |
| JP | 2019-512089 A | 5/2019 |
| WO | 2011049975 A1 | 4/2011 |

\* cited by examiner

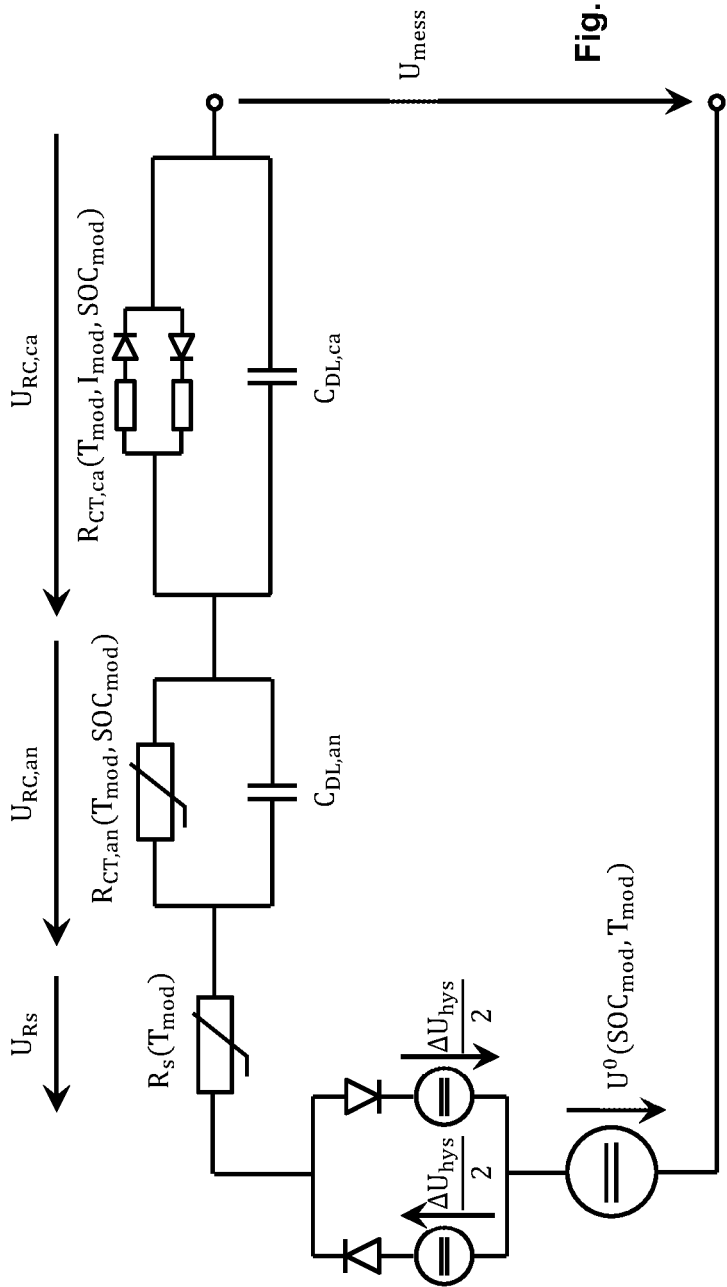
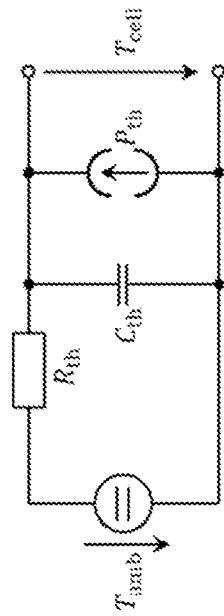
Fig. 3a
Fig. 3b

METHOD AND DEVICE FOR DETERMINING THE STATE OF CHARGE AND THE STATE OF HEALTH OF A RECHARGEABLE BATTERY

The invention relates to a method for determining the state of charge of a rechargeable battery of a specified battery type, or a parameter physically related thereto, in particular a remaining charge amount contained in the battery, as well as a method for determining the state of health of a rechargeable battery of a specified battery type, or a parameter physically related thereto, in particular a present capacity of the battery. The invention furthermore relates to a device for carrying out these methods.

The state of charge (SOC) of a rechargeable battery is defined as $$SOC = \frac{Q}{C}.$$

The state of health (SOH) of a rechargeable battery is defined as $$SOH = \frac{C}{C_N}.$$

In these equations, Q denotes the remaining charge amount in the battery, C the capacity, i.e. the amount of charge that can be taken from a fully charged battery, and $C_N$ the nominal capacity, i.e. the capacity of a new battery. SOC and SOH are defined as dimensionless variables between 0 and 1. In practice, SOC and SOH are often specified as a percentage value.

Nowadays, in many battery systems the SOC determination is carried out by a so-called battery management system (BMS), which provides this information to the user, for example by means of a display. A large number of different methods are known for the approximate determination of the SOC, including among others model-based methods. These operate exclusively on the basis of current-controlled battery models, with the result that measured values for the battery current are necessary as input signal. However, current measurements are not possible with the desired accuracy, with the result that the accuracy of the known methods is often not good enough for determining the SOC.

Methods for determining the SOH are often based on measuring the battery current during a cycle between a fully discharged and a fully charged state of the battery. However, this is not possible during the normal use of the battery.

Starting from this state of the art, the object of the invention is to provide a method for the approximate determination of the state of charge of a rechargeable battery of a specified battery type, or a parameter physically related thereto, in particular a remaining charge amount contained in the battery, which has an improved accuracy and additionally can be implemented easily in a battery management system. The object of the invention is furthermore to provide a method for determining the state of health of a rechargeable battery of a specified battery type, or a parameter physically related thereto, in particular a present capacity of the battery, which makes it possible to determine an approximate value for the state of health of the battery during the normal use of the battery. Finally, the object of the invention is to provide a device which makes it possible to carry out one or both of the above-named methods.

The invention starts from the knowledge that the use of a voltage-controlled dynamic mathematical battery model, which is described by an implicit system of equations, makes the simple determination of an approximate value for the SOC possible. For this, only the battery voltage needs to be measured (over a certain timespan). Depending on the specifically chosen battery model, the temperature of the battery and the ambient temperature can additionally be used as input variables for the battery model. The model can also include certain time dependences, for example a hysteresis behaviour of the battery or a time dependence of double layers.

At the same time, the voltage-controlled battery model provides the (model) battery current as output variable. According to the invention, this is used to determine the SOH of the battery.

The method according to the invention utilizes a dynamic mathematical battery model for the battery or the specified battery type (i.e. a plurality of similar batteries), which links a state of charge of the battery $SOC_{mod}$, or a parameter physically related thereto, in particular the remaining charge amount Q contained in the battery, to a battery current $I_{mod}$, and which defines a voltage $U_{meas}$ measured between two terminals (poles) of the battery as a function of a sum of an open circuit voltage $U^0$ of the battery and an overvoltage r, wherein the open circuit voltage $U^0$ depends at least on the remaining charge amount Q, or the parameter physically related thereto, and the overvoltage r depends at least on the battery current $I_{mod}$.

This dynamic mathematical battery model can then be parameterized for the specific battery or a specific battery type, i.e. the parameters for the battery model are chosen such that the parameterized model describes the specific battery or the specific battery type with sufficient accuracy.

The method according to the invention thus makes it possible to determine an approximate value $SOC_{mod}$ for the actual state of charge SOC of the battery, or the parameter physically related thereto, by measuring the battery voltage $U_{meas}$ and calculating the approximate value $SOC_{mod}$ using the parameterized dynamic mathematical battery model.

A device for carrying out this method thus only needs to be formed to measure the battery voltage $U_{meas}$, for example by means of a unit for measuring the battery voltage $U_{meas}$, and to calculate the approximate value $SOC_{mod}$ for the SOC of the battery from the measured battery voltage $U_{meas}$. For this, the device can comprise an arithmetic unit for calculating the SOC. The parameterized battery model can likewise be stored in the arithmetic unit for this or be supplied to it from a superordinate unit.

In addition, the battery model also makes it possible to calculate the (model) battery current $I_{mod}$. According to the invention, this can also be used in a further step to determine an approximate value $SOH_{mod}$ for the actual SOH of the battery (see below). When using the method according to the invention to determine an approximate value for the SOH of a battery it is not absolutely necessary also to determine the SOC of the battery. This is because, of course, the use of a voltage-controlled dynamic mathematical battery model makes it possible for only the (model) battery current $I_{mod}$ to be calculated, without it being necessary to output or use the SOC of the battery beforehand or at the same time.

In its full design, however, the method according to the invention provides an algorithm (a mathematical instruction), which makes it possible to determine the state of charge SOC and the state of health SOH from measured values for the battery voltage $U_{meas}$ and the current $I_{meas}$ of the battery—and optionally from measured values for the temperature $T_{meas}$ of the battery and the ambient temperature. This fully designed method is represented schematically in FIG. 1. It consists of an overall algorithm 100, which comprises two components, namely a first component 102 with a battery model and an algorithm for the SOC determination and a second component 104 with an SOH algorithm for the SOH determination. The measured battery voltage $U_{meas}$, and optionally the measured temperature $T_{meas}$ of the battery, are supplied to the first component 102 as essential input variables. Instead of the measured temperature $T_{meas}$, the ambient temperature $T^{amb}$ can also be supplied to the battery model, if the battery model comprises a thermal submodel. In the full design of the method according to the invention, the first algorithm component 102 with the dynamic mathematical battery model provides, as output variable, a value $SOC_{mod}$, which is used as approximate value for the actual SOC of the battery 106. The second algorithm component 104 receives, as input variables, for one thing the value for the model battery current $I_{mod}$ calculated by means of the battery model and for another the measured battery current $I_{meas}$. The second algorithm component provides, as output variable, a value $SOH_{mod}$, which is used as approximate value for the actual SOH of the battery 106.

According to a design of the invention, the dynamic mathematical battery model can consist of or be developed from an implicit system of equations which comprises the following equations:

$$\frac{dSOC_{mod}}{dt} = -\frac{I_{mod}}{C_N}$$

$$U_{meas} = U^0(SOC_{mod}, T_{meas}, t) + \eta(I_{mod}, SOC_{mod}, T_{meas}, t)$$

wherein $C_N$ denotes a specified nominal capacity of the battery, $T_{meas}$ a measured temperature of the battery and t the time, wherein the open circuit voltage $U^0$ necessarily exhibits a dependence on the state of charge $SOC_{mod}$, whereas the dependence on the measured temperature $T_{meas}$ and the time t is optional, and wherein the overvoltage r necessarily exhibits a dependence on the battery current $I_{mod}$, whereas the dependence on the state of charge $SOC_{mod}$, the measured temperature $T_{meas}$ and the time t is optional.

These two still very generally formulated relationships implicitly describe the behaviour over time of the two sought unknowns $SOC_{mod}$ and $I_{mod}$. Whereas the first equation merely describes that the change in the remaining charge contained in the battery corresponds to the battery current and in this way can be adopted for all further, specific designs or formulations of the mathematical battery model, the second equation can be adapted to a specifically chosen battery model and, if necessary, be replaced by a complex system of equations which describes the chosen battery model in mathematical and physical terms.

For example, according to a design of the invention, the open circuit voltage $U^0$ can be assumed to be exclusively dependent on the state of charge $SOC_{mod}$ and the battery can be assumed to have a constant internal resistance $R_i$. Furthermore, it can be assumed that the battery model is temperature-independent. In this case, the above general equations for the battery model can be replaced by the following equations:

$$\frac{dSOC_{mod}}{dt} = -\frac{I_{mod}}{C_N}$$

$$U_{meas} = U^0(SOC_{mod}) - R_i \cdot I_{mod},$$

wherein the dependence of the open circuit voltage $U^0$ on the state of charge $SOC_{mod}$ is determined in particular by measurement, in particular as measured discrete values or as an analytical function. In this case, a system of equations that is very easy to solve results, which can be implemented in a battery management system with little effort.

In the case of this battery model, the two equations above can be solved by analytical inversion, wherein the state of charge $SOC_{mod}$ can be calculated from the equations $$\frac{dSOC_{mod}}{dt} = -\frac{1}{R_i \cdot C_N} \cdot \left( U^0(SOC_{mod}) - U_{meas} \right)$$

$$I_{mod} = \frac{1}{R_i} \left( U^0(SOC_{mod}) - U_{meas} \right).$$

The dependence $U^0(SOC_{mod})$ can either be indicated in tabular form, i.e. in the form of measured values, or in the form of an analytical function. It should already be noted at this point that the model current $I_{mod}$ can of course also be calculated from these equations, if the SOH is also to be determined in addition to the SOC. Depending on the method chosen for solving the two above-named equations, only the first-named equation can also be enough to calculate the SOC. If the modelled battery current $I_{mod}$ is also to be calculated in addition, then the second-named equation must also be used in any case.

In practice, to calculate the $SOC_{mod}$, the above-named pairs of equations will be solved by means of numerical methods, since the input variables supplied to the algorithm for determining the $SOH_{mod}$ are also captured in the form of discrete measured values, preferably at an equidistant interval $\Delta t$ (sampling interval). In particular, the voltage $U_{meas}$ is captured in the form of discrete measured voltage values $U_{meas}^i$ at a specified interval $\Delta t$. The specified interval can also vary. The measured values can also be captured at specified points in time.

To solve the above equations for the assumed, very simple battery model numerically, the explicit forward Euler method can be used for discretization. This discretization method leads to the relationships $$SOC_{mod}^{i+1} = SOC_{mod}^i - \frac{\Delta t}{R_i \cdot C_N} \cdot \left( U^0(SOC_{mod}^i) - U_{meas}^i \right)$$

$$I_{mod}^i = \frac{1}{R_i} \left( U^0(SOC_{mod}^i) - U_{meas}^i \right)$$

wherein the respective variables are provided with an index i, which denotes a time step of $\Delta t$. Of course, a suitable start value for $SOC_{mod}^{i=0}$ needs to be chosen.

In place of the explicit forward Euler method, other explicit or also implicit methods can also be used for discretization of the above equations. However, in the case of the implicit backward Euler method, a solution in closed form is no longer possible. In this case, further numerical methods, such as e.g. Newton's method, have to be used.

However, a special case arises if, according to a design of the invention, a linear correlation is assumed between the open circuit voltage and the SOC of the battery. As a result, the equations for the simple battery model indicated above are simplified further to $$\frac{dSOC_{mod}}{dt} = -\frac{1}{R_i \cdot C_N}((U_L - U_E) \cdot SOC_{mod} + U_E - U_{meas})$$

and $$I_{mod} = \frac{1}{R_i}((U_L - U_E) \cdot SOC_{mod} + U_E - U_{meas})$$

wherein $U_L$ denotes an end-of-charge voltage and $U_E$ an end-of-discharge voltage.

From these equations, the approximate value for the state of charge SOC, thus the value $SOC_{mod}$, can be calculated using a mathematical discretization method and, where appropriate, further numerical methods. If the implicit backward Euler method is used, this leads to the equations $$I_{mod}^{i+1} = \frac{1}{\frac{(U_L - U_E)}{C_N}\Delta t + R_i}((U_L - U_E) \cdot SOC_{mod}^i + U_E - U_{meas}^{i+1})$$

and $$SOC_{mod}^{i+1} = SOC_{mod}^i - \frac{I_{mod}^{i+1}}{C_N}\Delta t,$$

from which $SOC_{mod}$ can likewise be calculated easily. As already mentioned, a value for the battery current $I_{mod}$ would not necessarily also need to be calculated to determine $SOH_{mod}$, but it results automatically anyway in this special case as a result of the coupling of the two equations.

According to a further embodiment of the invention, the method for determining the SOC or SOH of the battery can also be carried out by means of a relatively complex equivalent circuit model for the battery according to FIG. 3. This battery model can be described by the following equations:

$$\frac{dSOC_{mod}}{dt} = -\frac{I_{mod}}{C_N}$$

$$U_{meas} = U^0(SOC_{meas}, T_{mod}) + \Delta U_{hys}(I_{mod}) - U_{RC,an} - U_{RC,ca} - I_{mod} \cdot R_s(T_{mod})$$

$$\frac{dU_{RC,an}}{dt} = \frac{1}{C_{DL,an}(T_{mod})}\left(I_{mod} - \frac{U_{RC,an}}{R_{CT,an}(T_{mod})}\right)$$

$$\frac{dU_{RC,ca}}{dt} = \frac{1}{C_{DL,ca}(T_{mod})}\left(I_{mod} - \frac{U_{RC,ca}}{R_{CT,ca}(T_{mod}, I_{mod})}\right)$$

$$\frac{dU_{mod}}{dt} = \frac{1}{C_{th}}\left(I_{mod}^2 R_s(T_{mod}) + \frac{U_{RC,an}^2}{R_{CT,an}(T_{mod})} + \frac{U_{RC,ca}^2}{R_{CT,ca}(T_{mod}, I_{mod})} - \frac{T_{mod} - T_{meas}^{amb}}{R_{th}} + I_{mod} \cdot (T_{mod} - T^0) \cdot \frac{dU^0(SOC_{mod})}{dT}\right)$$

wherein $U_{RC}$ denotes a voltage drop across an RC element, $R_{CT}$ a charge transfer resistance, $C_{DL}$ a double-layer capacitance, $C_{th}$ a thermal capacity, $R_{th}$ a thermal transfer resistance at the battery surface, $dU^0(SOC_{mod})/dT$ a temperature dependence of the open circuit voltage, $T^0$ an associated reference temperature and $T_{meas}^{amb}$ a measured ambient temperature of the battery, wherein the indices "an" and "ca" refer to an anode and a cathode of the battery and wherein an asymmetry of the open circuit voltage $U^0$ is described by $\Delta U_{hys}$ and an asymmetry of the cathode resistance is described by a current dependence on $R_{CT,ca}$. The value for $SOC_{mod}$, thus an approximate value for the actual state of charge SOC, can be calculated from this system of equations, preferably by means of one or more numerical mathematical methods.

The method according to the invention for determining the state of health of a rechargeable battery of a specified battery type, or a parameter physically related thereto, in particular a present capacity C of the battery, comprises the following steps:

determining a charge amount $Q_{in,meas}$ received by the battery during a first observation period and a charge amount $Q_{out,meas}$ provided by the battery during a second observation period by measuring and integrating a battery current $I_{meas}$ provided or received by the battery, wherein the second observation period is preferably chosen to be identical to or at least overlapping the first observation period;

calculating a charge amount $Q_{in,mod}$ received by the battery during the first observation period and a charge amount $Q_{out,mod}$ provided by the battery during the second observation period using a voltage-controlled dynamic mathematical battery model parameterized for the battery or the specified battery type, in particular a dynamic mathematical battery model, determining an approximate value $SOH_{mod}$ for the actual state of health SOH by calculating a charge state of health $SOH_{in}$ as a quotient of the charge amount $Q_{in,meas}$ and the charge amount $Q_{in,mod}$ and/or a discharge state of health $SOH_{out}$ as a quotient of the charge amount $Q_{out,meas}$ and the charge amount $Q_{out,mod}$ and using the charge state of health $SOH_{in}$ or the discharge state of health $SOH_{out}$ or an average value calculated herefrom as approximate value $SOH_{mod}$ for the actual state of health SOH.

This should clarify that, in the step of calculating the charge amounts $Q_{in,mod}$ and $Q_{out,mod}$ using the voltage-controlled battery model, measurement data for the voltage of the battery are of course also used.

According to an embodiment, the first and the second periods can be chosen such that the charge amounts $Q_{in,meas}$ charged and/or the charge amounts $Q_{out,meas}$ discharged during the period in question, and/or the sum of these amounts, are greater than a value predefined in each case, wherein the predefined value is preferably greater than the nominal capacity $C_N$ of the battery. A sufficient accuracy of the determined value $SOH_{mod}$ can hereby be guaranteed.

According to a further embodiment, the end points of the first and second periods can be chosen such that the same state of charge $SOC_{ref}$ exists at the end points as at the start points and/or that the same current direction of the measured battery current $I_{meas}$ prevails at the end points as at the start points. The influence of hysteresis effects or model deviations can hereby be reduced.

The variants of battery models explained above and the methods presented for them for solving the systems of equations make a simple calculation of the battery current $I_{mod}$ possible. The charge amounts $Q_{in,mod}$ and $Q_{out,mod}$ can be calculated easily according to the invention through analytical or numerical integration of the battery current $I_{mod}$ calculated from the dynamic mathematical battery model. Thus, the approximate value $SOH_{mod}$ for the actual state of health of the battery can also be determined very easily.

Further embodiments of the invention result from the dependent claims.

Figure 2:
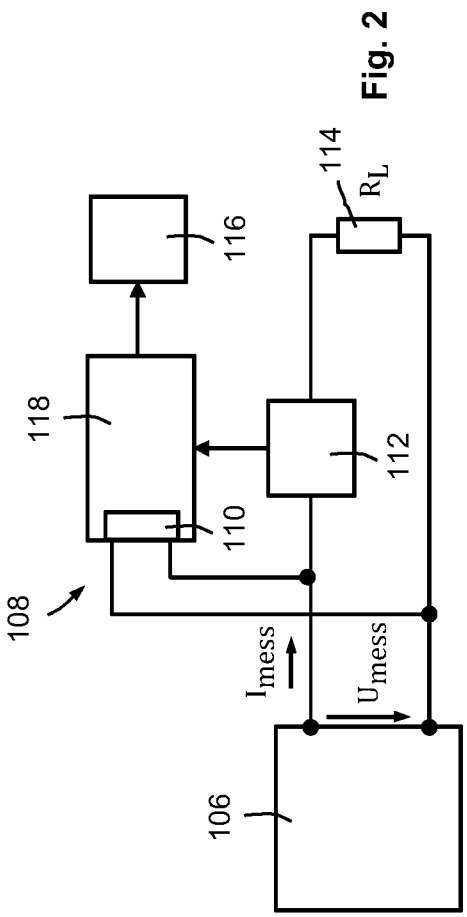
Figure 4:
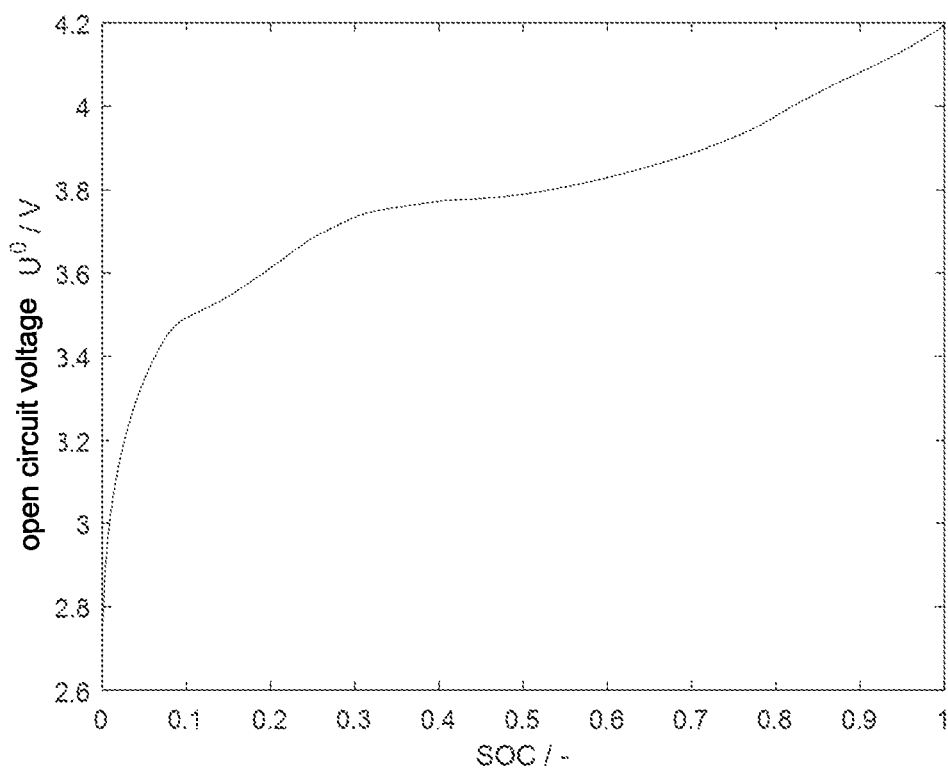
Figure 5A:
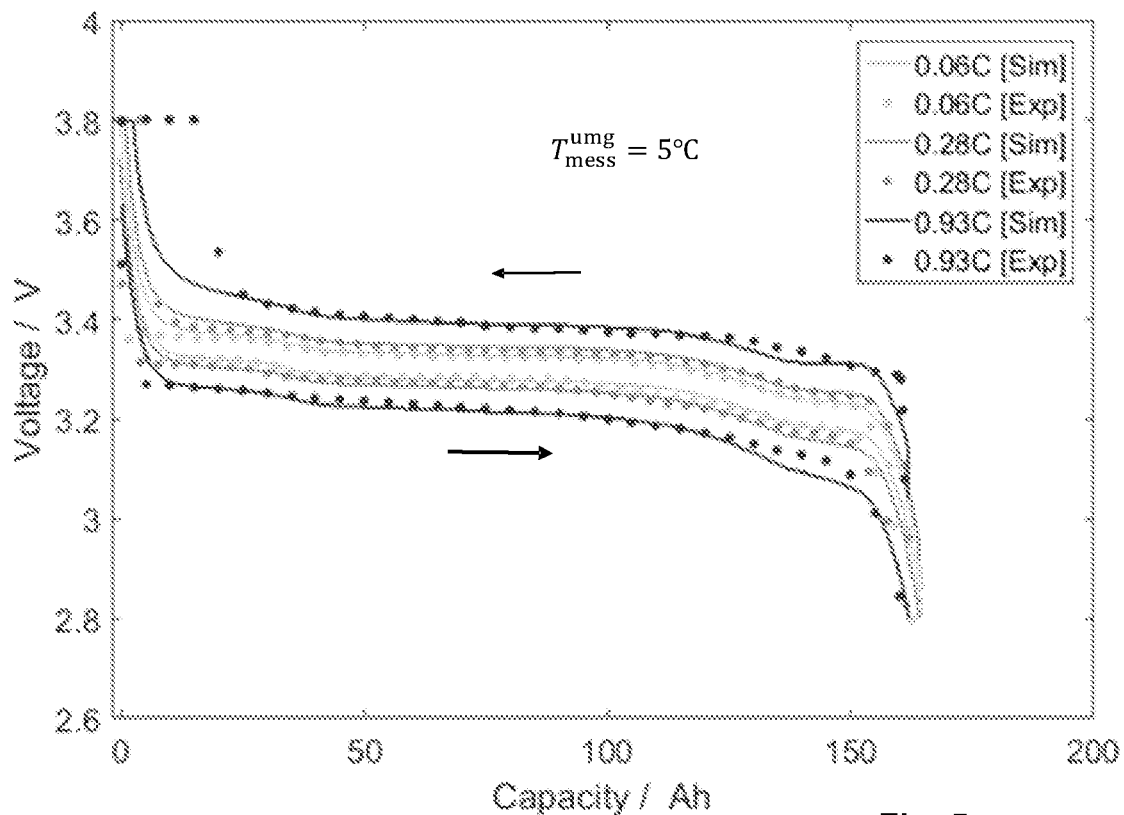
Figure 5B:
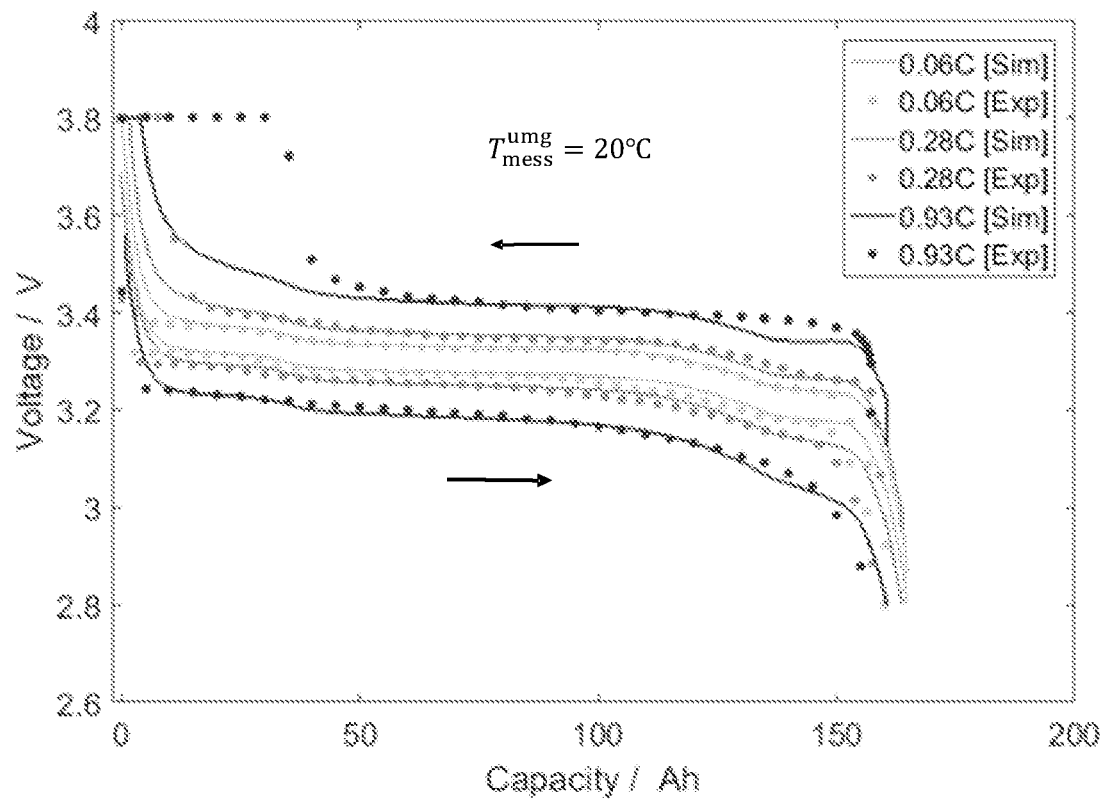
Figure 5C:
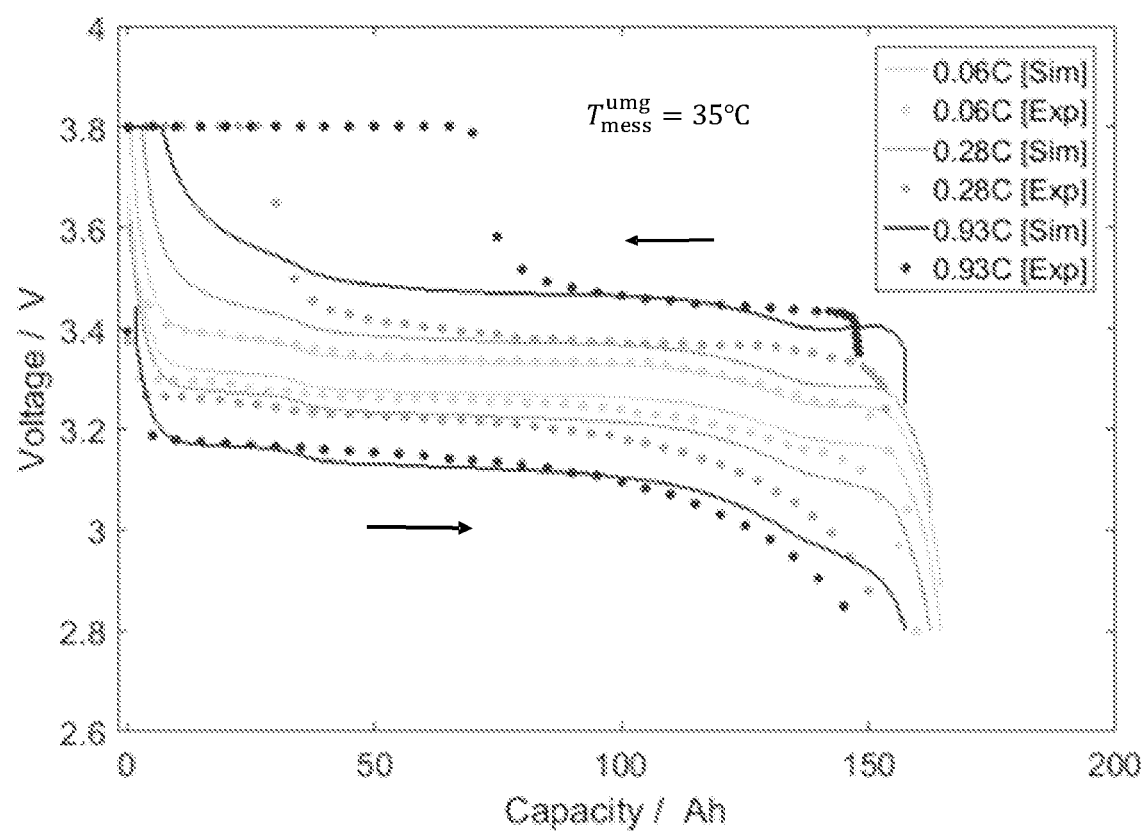
Figure 6A:
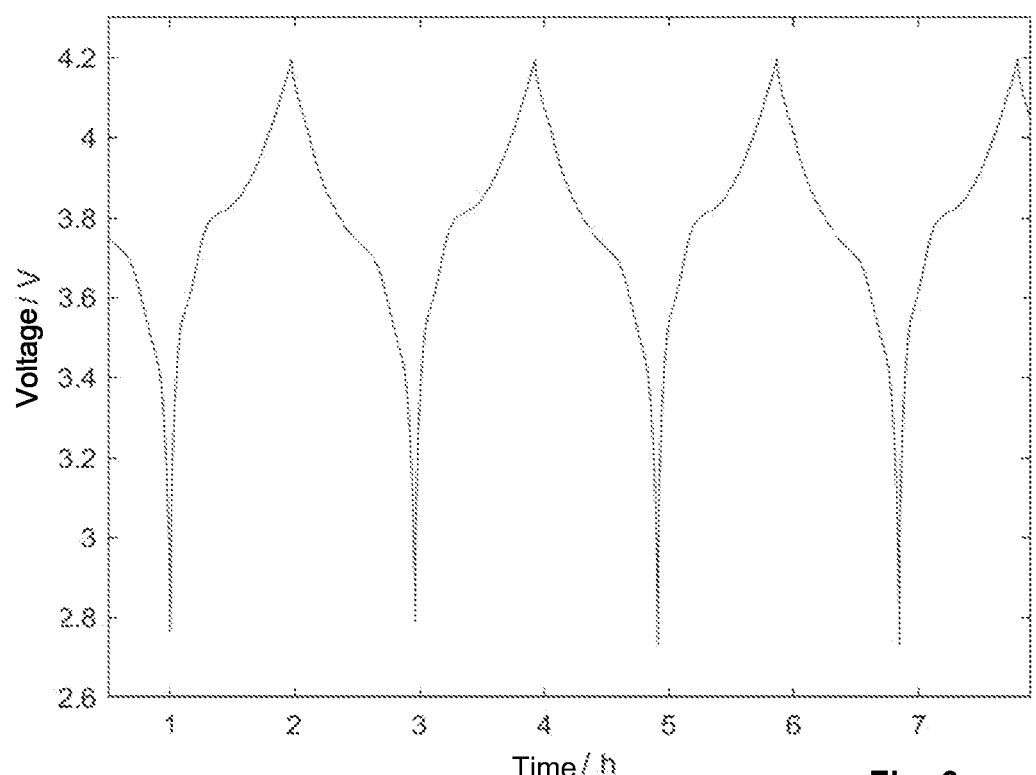
Figure 6B:
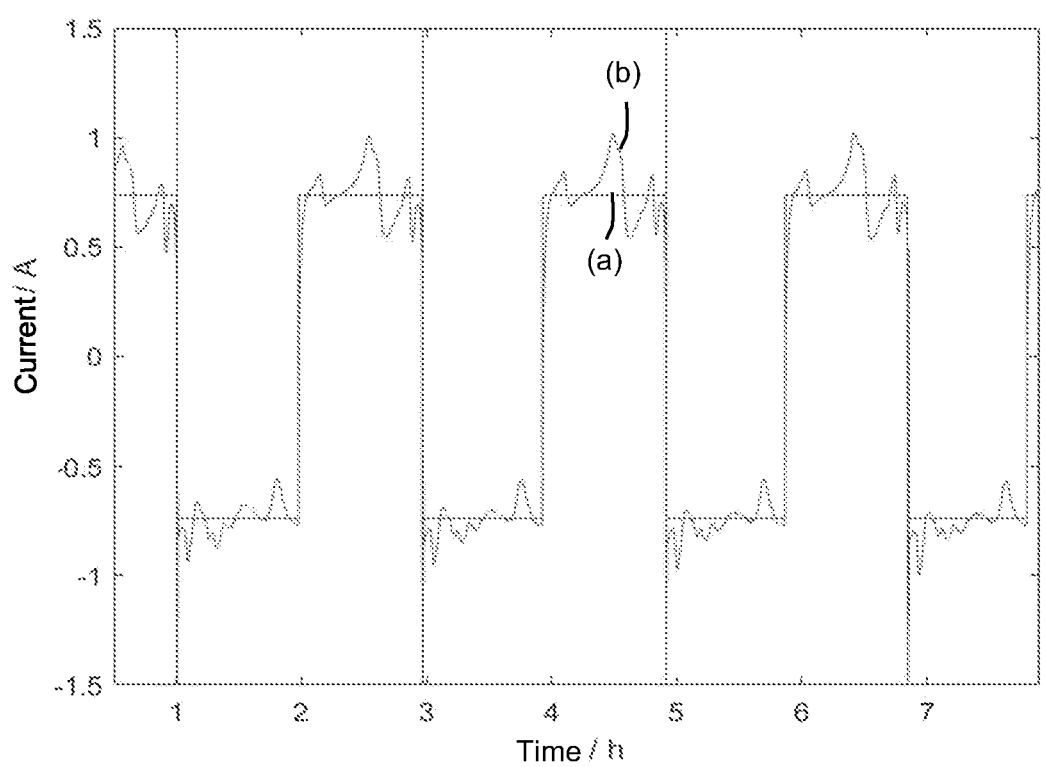
Figure 7A:
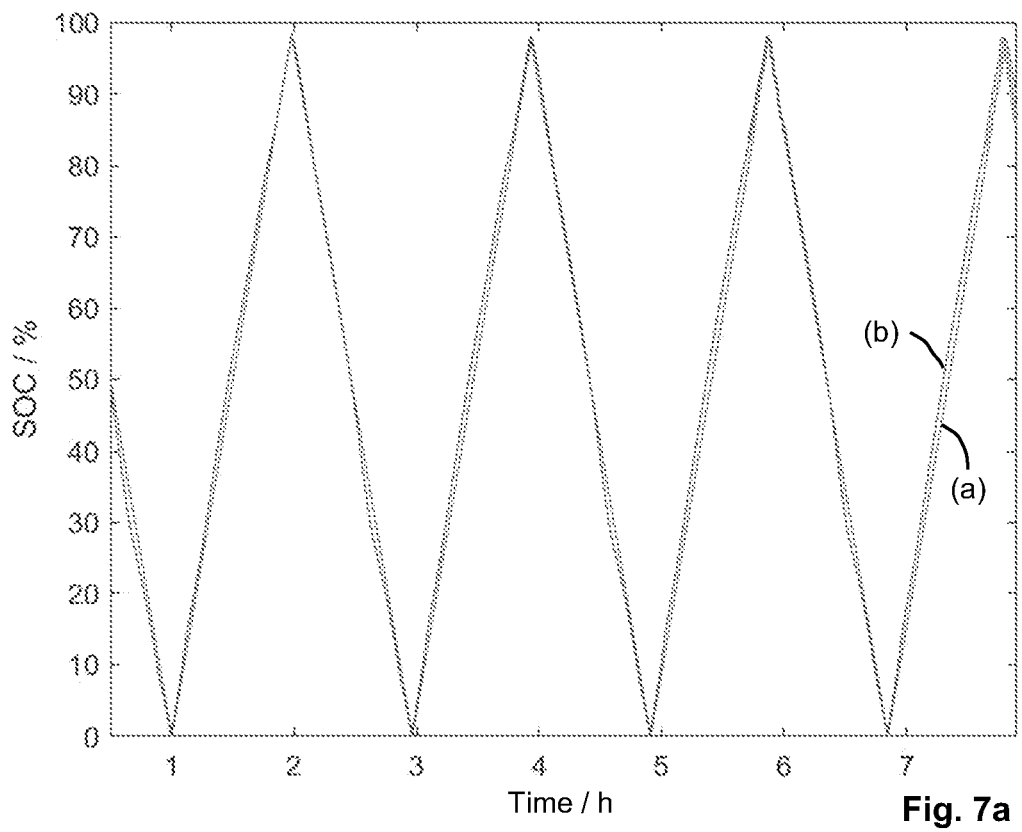
Figure 7B:
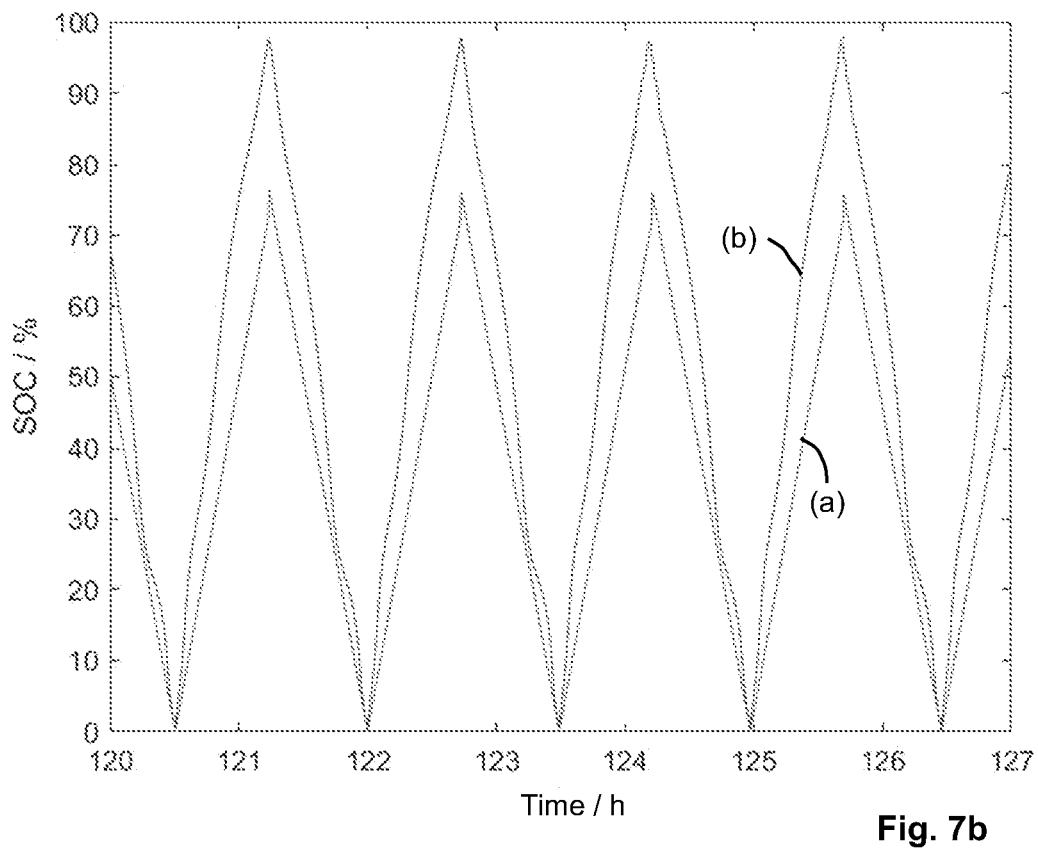
Figure 8:
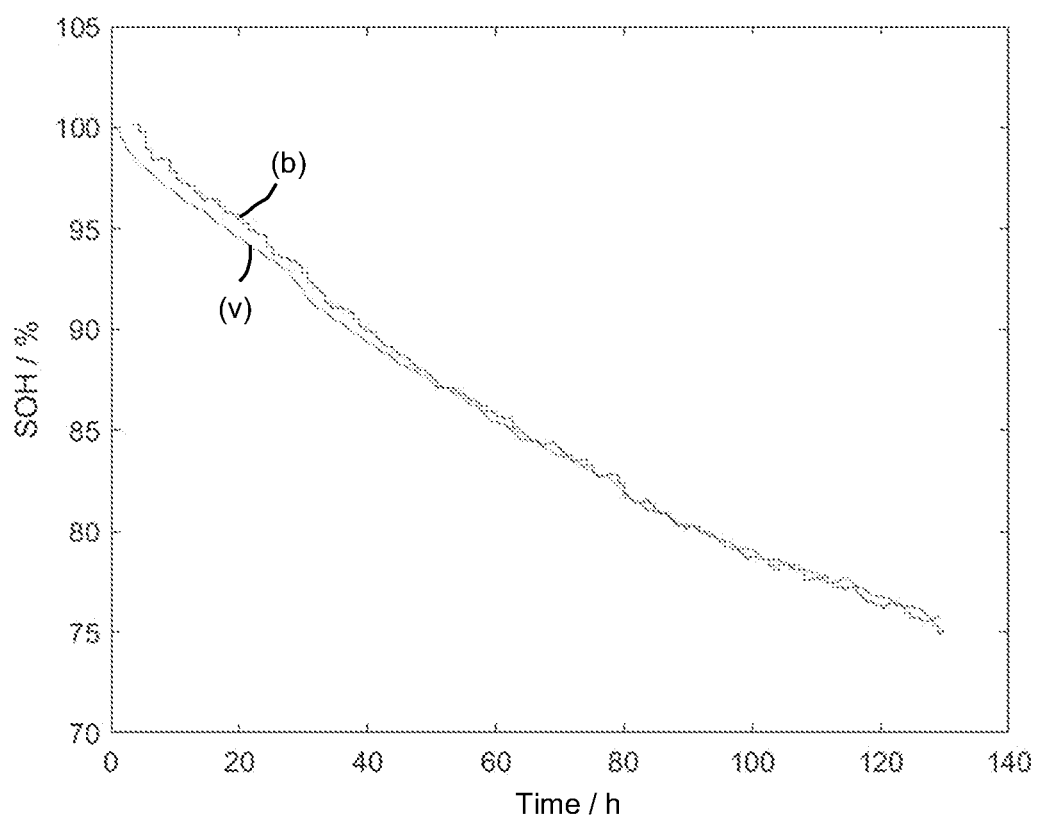
Figure 9A:
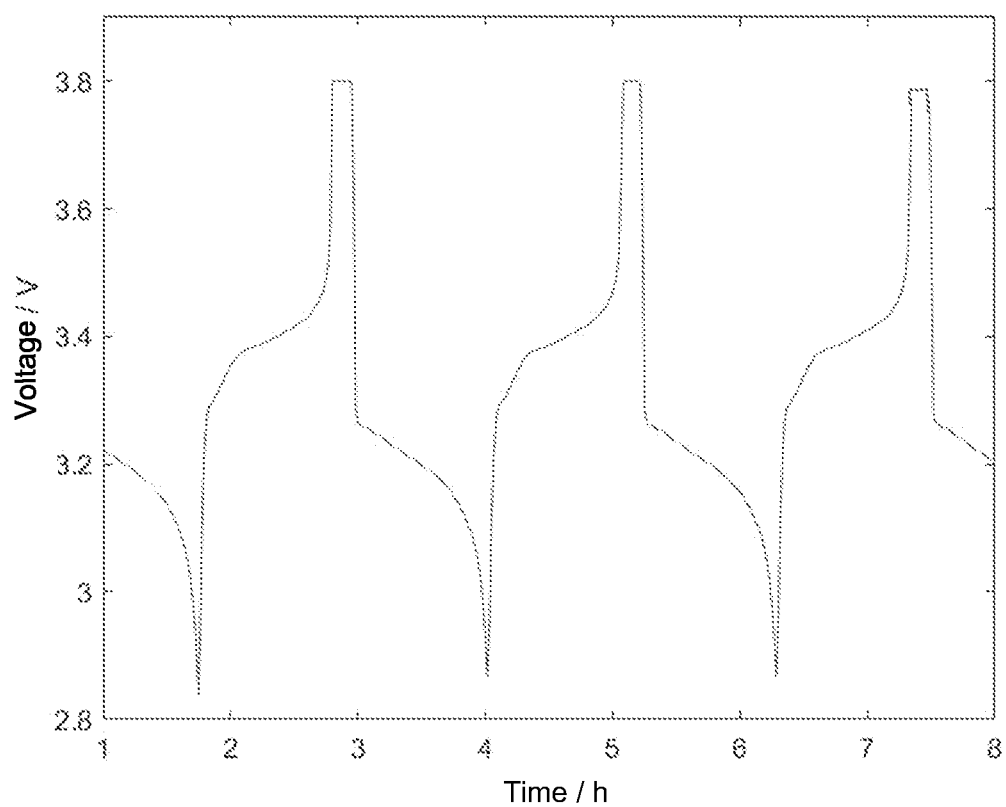
Figure 9B:
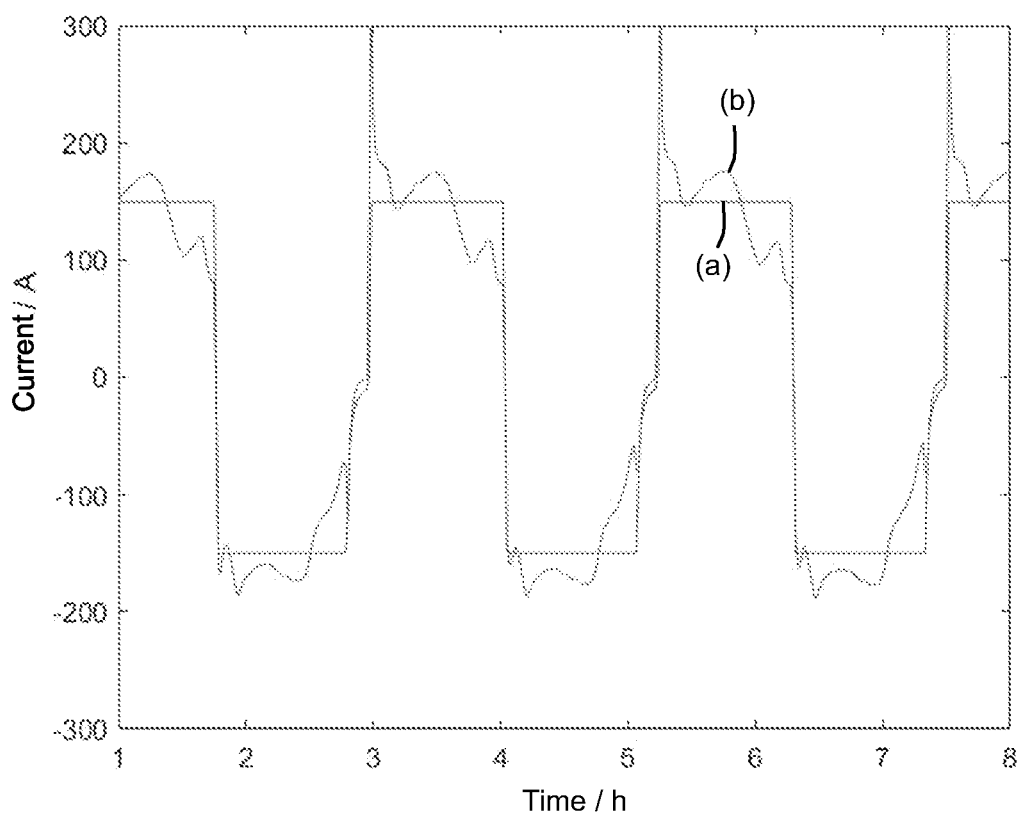

The invention is explained in more detail below with reference to embodiment examples represented in the drawing. There are shown in the drawing:

FIG. 1 a schematic diagram of the method according to the invention;

FIG. 2 a schematic block diagram of a battery operated under load with a device according to the invention for carrying out the method;

FIG. 3 a specific, complex equivalent circuit model for a lithium-iron phosphate-based lithium-ion cell, which consists of an electrical submodel (FIG. 3a) and a thermal submodel (FIG. 3b);

FIG. 4 a $U^0(SOC)$ graph of a lithium-ion battery with nickel-manganese-cobalt oxide/graphite chemistry (NMC/graphite) from the manufacturer Kokam, type SLPB533459H4, with a nominal capacity of 0.74 Ah and a nominal voltage of 3.7 V;

FIG. 5 simulated discharge-charge characteristic curves (battery voltage against charge amount) for the battery according to FIG. 3 at three temperatures (FIG. 5a at 5° C.; FIG. 5b at 20° C. and FIG. 5c at 35° C.) and three currents (0.06 C, 0.28 C, 0.93 C), wherein for the simulation, model B was parameterized onto this battery;

FIG. 6 a section of the 100 successive charge cycles according to Birki for the battery according to FIG. 4, wherein FIG. 6a shows the measured voltage $U_{meas}$ as input variable for the battery model and FIG. 6b the measured current (curve (a) and the current calculated with the battery model (model A) (curve (b));

FIG. 7 results of the novel method (according to model A) for the battery according to FIG. 4, wherein FIG. 7a represents the state of charge SOC during the first hours of the cycling according to Birkl and FIG. 7b the state of charge SOC during the final hours; the results of the method (curves (b)) are contrasted with results determined according to a conventional method (curves (a));

FIG. 8 results of the novel method for the state of health SOH over the entire duration of the test (curve (b)) using model A; an SOH curve which was obtained by coulomb counting (curve (v)) is contrasted with these results;

FIG. 9 results of an experiment with the novel method for a lithium-ion battery for stationary storage means with LFP/graphite chemistry with a nominal capacity of 158 Ah for a plurality of discharge and charge cycles; FIG. 9a shows the measured voltage and FIG. 9b shows the measured (curve (a)) and the modelled (curve (b)) current (using battery model B); and FIG. 10 results of this method for the SOC (FIG. 10a; curves (b)) and the SOH (FIG. 10b); a precise comparison measurement (curves (v)) is contrasted with the results of the method.

FIGS. 1 and 2 show a schematic representation of the device and of the method according to the invention for determining the SOH and SOC of a battery 106, which is operated at a load $R_L$. As can be seen from FIG. 1, the method can be implemented by means of an overall algorithm 100, for example through integration into an already available battery management system. The overall algorithm 100 comprises a first component 102 for the SOC determination, which also comprises a dynamic mathematical battery model chosen for the specific battery or the specific battery type. The measured battery voltage $U_{meas}$ and the measured temperature $T_{meas}$ of the battery are supplied to this first component as input variables. In place of the measured temperature of the battery, the measured ambient temperature $T_{meas}^{amb}$ can also be supplied to this first component of the overall algorithm 100. This first component of the overall algorithm is capable of calculating the state of charge $SOC_{mod}$ and the current $I_{mod}$ (output variables) of the battery from the measured battery voltage $U_{meas}$ (input variable). The type of the battery model itself is unimportant for the method, as long as it meets these requirements. Empirical models, equivalent circuit models, multi-physical models or other models are conceivable. Only the output variable $SOC_{mod}$ is required for the SOC determination.

For determining the SOH, the overall algorithm 100 has a second component 104, to which the current $I_{mod}$ calculated by means of the first component 102, as well as the measured current $I_{meas}$, is supplied as input variable.

It is an essential property of the invention that the dynamic model operates in a voltage-controlled manner, i.e. with the measured voltage $U_{meas}$ as input variable. The state of charge to be delivered for the user results directly from the model. The delivery can be effected by means of a display unit, for example.

The accuracy of the method is heavily dependent on how accurately the model can reflect the actual SOC and the current $I_{meas}$ of the real battery from the given voltage, i.e. how well $SOC_{mod}$ and SOC or $I_{meas}$ and $I_{mod}$ correspond. To increase the accuracy, a measured temperature $T_{meas}$ of the cell or the surroundings $T_{meas}^{amb}$ or other measured variables can additionally be delivered to the model.

As represented in FIG. 2, this overall algorithm 100 can be easily integrated into an existing battery management system. For this, it is merely necessary for a device 108 for carrying out the method to be contained in the battery management system (not represented). The device 108 comprises a unit 110 for measuring the battery voltage $U_{meas}$, which is connected to the terminals (poles) of the battery 106. Furthermore, the device 108 comprises a unit 112 for measuring the battery current $I_{meas}$, which can be formed in any desired way. For example, the unit 112 can comprise a shunt resistor, which lies in the current path between the battery poles and any desired load $R_L$, which is also labelled with the reference number 114. The unit 112 can be formed to measure the voltage across the shunt resistor and to calculate the current from the measured voltage drop and the resistance value of the shunt resistor.

The device 108 can also comprise a display unit 116, on which the determined values for the SOC and SOH, are displayed. For carrying out the calculations necessary for implementing the method, the device 108 comprises an arithmetic unit 118, which can be formed for example as a microprocessor unit. The microprocessor unit can also have an analogue-to-digital converter, which samples analogue variables $U_{meas}$ and $I_{meas}$ supplied to it over time and converts them into digital values.

In the following, the basic principle of the method according to the invention as well as specific variants are now explained in more detail.

The battery model has two minimum requirements. First of all, it must be dynamic, i.e. there must be at least one time-dependent state variable. This is typically the remaining charge amount Q or the state of charge $$SOC = \frac{Q}{C_N},$$

which change over time as a result of an applied current. Secondly, the progression of the voltage must be described as a function of state of charge and current.

In a general representation, the model thus consists of two equations, $$\frac{dSOC_{mod}}{dt} = -\frac{I_{mod}}{C_N} \quad (1)$$

$$U_{meas} = U^0(SOC_{mod}, T_{meas}, t) + \eta(I_{mod}, SOC_{mod}, T_{meas}, t) \quad (2)$$

The two equations implicitly describe the behaviour over time of the two sought unknowns ($SOC_{mod}$, $I_{mod}$) as a function of the measured input variable $U_{meas}$ in the case of given parameters and battery properties ($C_N$, $U^0$, $\eta$).

The two terms on the right-hand side of the second equation represent the open circuit voltage $U^0$ as well as the overvoltage $\eta$, i.e. voltage drops due to slow inner processes such as reactions and transport. The open circuit voltage $U^0$ is mainly dependent on the SOC, with further possible dependences on the temperature and the charge/discharge history over time (e.g. in the case of battery materials with hysteresis such as lithium iron phosphate). The overvoltage is dependent on the SOC, the current $I_{mod}$ and the temperature $T_{meas}$ and also has a marked dynamic progression (over time) due to electrochemical double layers. To describe the behaviour of $U^0$ and $\eta$, further model equations can be used depending on the model complexity. Here and in the following, the algebraic sign of the battery current (measured and calculated) is chosen to be positive in the case of the battery discharging, i.e. I>0, and negative in the case of the battery charging, i.e. I<0.

Inversion is necessary in order to solve the implicit system of equations (1) and (2) according to $SOC_{mod}$ and $I_{mod}$. Depending on the model or implementation, this can be done analytically or numerically. The solution is shown by way of example in the examples mentioned below, however other methods are also conceivable.

The use of a real (e.g. measured) correlation between open circuit voltage $U^0$ and SOC, $U^0=U^0(SOC)$, the assumption of a constant internal resistance $R_i$, from which the overvoltage of $\eta=-R_i \cdot I_{mod}$ results, and the assumption of a temperature independence offers a possible implementation of the method. The system of equations (1) and (2) is thus simplified to $$\frac{dSOC_{mod}}{dt} = -\frac{I_{mod}}{C_N} \quad (3)$$

$$U_{meas} = U^0(SOC_{mod}) - R_i \cdot I_{mod}. \quad (4)$$

The correlation $U^0(SOC_{mod})$ can either be indicated in tabular form (e.g. measured values) or in the form of an analytical function. This model is referred to as "model A" or "simple model" in the following. The system of equations (3) and (4) is sufficiently simple that it can be inverted analytically. For this, equation (4) is solved according to $I_{mod}$ and the relationship obtained is used in equation (3). The following results $$\frac{dSOC_{mod}}{dt} = -\frac{1}{R_i \cdot C_N}\left(U^0(SOC_{mod}) - U_{meas}\right) \quad (5)$$

$$I_{mod} = \frac{1}{R_i}\left(U^0(SOC_{mod}) - U_{meas}\right) \quad (6)$$

where $U_{meas}$ is an independent (given) variable, $SOC_{mod}$ and $I_{mod}$ are dependent (sought) variables, and $U^0(SOC)$, $R_i$ and $C_N$ are model parameters.

In a real system, as a rule measured voltage values are measured in the form of discrete values $U_{meas}^i$ at a given interval $\Delta t$. Here, i is the index for a time step. To solve the system of equations (5) and (6) a temporal discretization is therefore necessary. A discretization according to the explicit forward Euler method gives the following solution:

$$SOC_{mod}^{i+1} = SOC_{mod}^i - \frac{\Delta t}{R_i \cdot C_N}\left(U^0(SOC_{mod}^i) - U_{meas}^i\right) \quad (7)$$

$$I_{mod}^i = \frac{1}{R_i}\left(U^0(SOC_{mod}^i) - U_{meas}^i\right) \quad (8)$$

Equation (7) forms a specific calculation instruction for the novel method for SOC determination. The present measured voltage value $U_{meas}^i$ is the only input variable. Only the $SOC_{mod}^i$ calculated in the previous step is necessary as stored value. The calculated new value $SOC_{mod}^{i+1}$ is passed to the user as present SOC of the battery. This determination of the SOC from equation (7) is thus extremely simple and can be carried out in a short time with low processing power. It can be implemented on a microcontroller without problems since only simple calculation steps are necessary. The measurement effort is also low; only the voltage $U_{meas}$ in the form of voltage values $U_{meas}^i$ at discrete times needs to be measured. Unlike in the case of conventional methods for SOC determination, a measurement of the current is not necessary.

Equation (8) provides the associated current $I_{mod}^i$ in parallel. This is not needed for the SOC determination but it is needed for the SOH determination (see below).

Equations (7) and (8) were derived from equations (5) and (6) through an explicit forward Euler discretization. There are also alternative discretization methods. An implicit backward Euler discretization is not possible in closed form due to the non-linear correlation $U^0(SOC_{mod})$ as further numerical methods would be necessary here (e.g. Newton's method). However, the assumption of a linear correlation between voltage and SOC according to the relationship $U^0=(U_L-U_E) \cdot SOC+U_E$, wherein $U_L$ denotes the end-of-charge voltage and $U_E$ the end-of-discharge voltage, forms a special case. Equations (5) and (6) are thus simplified further to $$\frac{dSOC_{mod}}{dt} = -\frac{1}{R_i \cdot C_N}((U_L - U_E) \cdot SOC_{mod} + U_E - U_{meas}) \quad (9)$$

$$I_{mod} = \frac{1}{R_i}((U_L - U_E) \cdot SOC_{mod} + U_E - U_{meas}) \quad (10)$$

The backward Euler discretization provides the following result:

$$I_{mod}^{i+1} = \frac{1}{\frac{(U_L - U_E)}{C_N}\Delta t + R_i}\left((U_L - U_E) \cdot SOC_{mod}^i + U_E - U_{meas}^{i+1}\right) \quad (11)$$

$$SOC_{mod}^{i+1} = SOC_{mod}^i - \frac{I_{mod}^{i+1}}{C_N}\Delta t \quad (12)$$

The calculation instruction is also very simple in this case. This form is also numerically more stable. However, the results would be severely affected by the greatly simplified and unrealistic linear $U^0(SOC_{mod})$ relationship. However, for sufficiently small time steps $\Delta t \leq 10$ s, calculations have shown no significant difference between explicit and implicit discretization.

Of course, other analytically indicated $U^0(SOC)$ relationships are also conceivable. Depending on the analytical form, the system of equations (5) and (6) can be solved analytically or with suitable numerical methods.

In the following, a complex battery model, also referred to as model B, and the use thereof for the SOC and SOH determination, is explained by way of example. Real batteries have a complicated dynamic current-voltage-temperature behaviour, which cannot be fully reproduced with the simple model of equations (5) and (6). To increase the reliability of the method, more complicated models can therefore also be used.

The equivalent circuit model shown in FIG. 3 is considered in the following. It is an electrical-thermal model. The electrical model consists of the open circuit voltage source $U^0(SOC)$, a series resistor $R_s$ as well as two resistor-capacitor (RC) elements ($R_{CT}$ and $C_{DL}$, one each for the two electrodes anode and cathode). Elements are also added which describe an asymmetry of the open circuit voltage ($\Delta U_{hys}$) and a charge/discharge asymmetry of the cathode resistance. The model is thus suitable for reproducing a lithium iron phosphate (LFP)/graphite lithium-ion cell (see H. Kim, "Modeling a parameterization of a commercial LFP/Graphite Lithium-ion cell considering charge and discharge characteristics", Master's thesis, Offenburg University, 2018), which exhibits these asymmetries. The thermal model consists of heat sources and a thermal transfer to the surroundings. All parameters are also assumed to be temperature-dependent.

The equivalent circuit model can be reproduced in the following differential-algebraic system of equations:

$$\frac{dSOC_{mod}}{dt} = -\frac{I_{mod}}{C_N} \quad (13)$$

$$U_{meas} = \quad (14)$$

$$U^0(SOC_{mod}, T_{mod}) + \Delta U_{hys}(I_{mod}) - U_{RC,an} - U_{RC,ca} - I_{mod} \cdot R_s(T_{mod})$$

$$\frac{dU_{RC,an}}{dt} = \frac{1}{C_{DL,an}(T_{mod})}\left(I_{mod} - \frac{U_{RC,an}}{R_{CT,an}(T_{mod})}\right) \quad (15)$$

$$\frac{dU_{RC,ca}}{dt} = \frac{1}{C_{DL,ca}(T_{mod})}\left(I_{mod} - \frac{U_{RC,ca}}{R_{CT,ca}(T_{mod}, I_{mod})}\right) \quad (16)$$

$$\frac{dT_{mod}}{dt} = \frac{1}{C_{th}}\left(I_{mod}^2 R_s(T_{mod}) + \frac{U_{RC,an}^2}{R_{CT,an}(T_{mod})} + \frac{U_{RC,ca}^2}{R_{CT,ca}(T_{mod}, I_{mod})} - \frac{T_{mod} - T_{meas}^{amb}}{R_{th}} + I_{mod} \cdot (T_{mod} - T^0) \cdot \frac{dU^0(SOC_{mod})}{dT}\right) \quad (17)$$

Here, $U_{RC}$ is the voltage drop across the RC element, $R_{CT}$ the charge transfer resistance, $C_{DL}$ the double-layer capacitance, $C_{th}$ the thermal capacity, $R_{th}$ the thermal transfer resistance at the battery surface, $dU^0(SOC_{model})/dT$ the temperature dependence of the open circuit voltage, $T^0$ the associated reference temperature, and the indices an and ca mean "anode" and "cathode", thus the two electrodes. The asymmetry of the open circuit voltage is described by $\Delta U_{hys}$, and the asymmetry of the cathode resistance is described by the current dependence on $R_{CT,ca}$. By comparing equations (13) and (14) with equations (1) and (2), it can be seen that this is a further form of the basic model. For the description, the additional equations (15) to (17) are required. As before, equations (13) to (17) implicitly describe the behaviour over time of the two sought unknowns ($SOC_{mod}$, $I_{mod}$) as a function of the measured input variables, namely the voltage $U_{meas}$ and the ambient temperature $T_{meas}^{amb}$.

Due to the coupling of the equations, an analytical solution is not possible. For the simulation results explained below, an implicit numerical solver was used, which is provided in the MATLAB software package. However, the solution is also possible with other methods.

It should be expressly noted again that the two models A and B presented only serve to demonstrate the novel method, which is not limited in any way to these two specific models, however. Rather, any simpler or even more complex models are conceivable.

The models presented above (A: "simple model" and B: "equivalent circuit model") can describe different batteries or battery types depending on parameterization. In the following, two models are parameterized onto specific lithium-ion battery cells.

As an exemplary representative of a battery used in the field of electromobility, a lithium-ion battery with nickel-manganese-cobalt oxide/graphite chemistry (NMC/graphite), specifically a cell from the manufacturer Kokam, model SLPB533459H4, with a nominal capacity of 0.74 Ah and a nominal voltage of 3.7 V, is considered. Birkl and Howey provide detailed datasets from this cell for unrestricted use (Christoph Birkl, David Howey, "Oxford Battery Degradation Dataset 1", University of Oxford, DOI: 10.5287/bodleian:KO2kdmYGg, web page: https://ora.ox.ac.uk/objects/uuid:03ba4b01-cfed-46d3-9b1a-7d4a7bdf6fac (2017)), which are eminently suitable for demonstrating the present method.

Model A ("simple model") is parameterized onto this cell as follows: the open circuit voltage curve $U^0(SOC)$ was determined by forming the average value of a charge and a discharge characteristic curve, which were recorded in each case with 40 mA ("virtual open circuit voltage"). The capacity was scaled to the maximum. The $U^0(SOC)$ relationship thus obtained is represented in FIG. 4. The nominal capacity $C_N=0.74$ Ah was taken directly from the manufacturer's information. The internal resistance was determined by reading the cell charge voltages from the experiments in each case at 50% SOC for discharges with 40 mA and 740 mA, resulting in $$R_i = -\frac{U(40 \text{ mA}) - U(740 \text{ mA})}{40 \text{ mA} - 740 \text{ mA}} = 0.0464\Omega.$$

The parameters are assumed to be temperature-independent. The full parameterization thus requires only two experimental charge/discharge characteristic curves (at 40 mA and 740 mA).

As an exemplary representative of a cell chemistry used in the field of stationary energy storage means (domestic storage means, commercial storage means, storage means for network applications, uninterrupted power supply), a lithium-ion battery with lithium iron phosphate/graphite chemistry (LFP/graphite), specifically a cell from the manufacturer Sinopoly, model SP-LFP180AHA, with a nominal capacity of 180 Ah and a nominal voltage of 3.2 V, is considered in the following. This cell was characterized at Offenburg University (see H. Kim, loc. cit.).

For this example, model B (equivalent circuit model) was parameterized onto this specific cell. FIG. 5 shows simulated discharge-charge characteristic curves (cell voltage against charge amount) after successful parameterization at three temperatures (5° C., 20° C. and 35° C.) and three currents, wherein the currents are indicated with the unit of the C rate (i.e. in the present case 1 C=180 A). The arrows indicate the direction in which the curves are passed through, as the discharge direction (arrow towards the right) and the charge direction (arrow towards the left). In each case, the upper one of the curves belonging together is the charge curve in each case and the lower one the discharge curve. The curves represented darkest (right at the top and right at the bottom) are the charge and discharge curves for a current of 0.93 C, and the upper and lower ones of the innermost curves (represented lightest) are the charge and discharge curves for a current of 0.06 C. The curves lying between these curves are the charge and discharge curves for a current of 0.28 C. The points of the curves represent measured values and the continuous lines the simulated values. As can be seen from FIG. 5, the measured values, including the asymmetry and hysteresis of the experiments, can be very well predicted by the model across the entire range.

In the following, the determination of the SOH by means of the SOH algorithm is explained in more detail. The specific application thereof likewise assumes the above-explained parameterization of the dynamic mathematical battery model used.

The above-represented battery models are capable of also providing the current $I_{mod}$ as output variable in addition to the state of charge $SOC_{mod}$. In addition to the current according to the model, the measured current $I_{meas}$ is also required for the SOH determination. The SOH algorithm is capable of calculating the state of health SOH from $I_{mod}$ and $I_{meas}$.

The algorithm is based on the fact that, as "digital twin", the battery model carries out the same cyclings as the real battery since (as explained above) it is operated with the same voltage as the real battery. However—in contrast to the real battery—the battery model does not age. The SOH can therefore be determined from the difference between $I_{mod}$ (without capacity loss) and $I_{meas}$ (with capacity loss). For this, coulomb counters are used, i.e. the measured current $I_{meas}$ and the current determined by means of the model $I_{mod}$ are integrated. This calculation is represented in the following.

As explained above, a voltage-controlled battery model is assumed for the algorithm, as only then is $I_{mod}$ an output variable which can be compared with $I_{meas}$. The novel method for SOH determination is thus closely linked to the novel method for SOC determination.

For a complete battery discharge (full to empty), which begins at point in time $t_0$ and is finished at point in time $t_l$, an $SOH_{out}$ can be defined by the relationship:

$$SOH_{out} = \frac{\int_0^{t_1} I_{bat,pres} dt}{\int_0^{t_1} I_{bat,n} dt} \quad (18)$$

wherein $I_{bat,n}$ denotes the battery current of a new (not aged battery) and $I_{bat,pres}$ the battery current of the aged battery.

Assuming that $I_{bat,pres}$ corresponds to the measured current of the real battery (with capacity loss) and $I_{bat,n}$ to the simulated current from the battery model (without capacity loss), the $SOH_{out}$ can be represented as:

$$SOH_{out} = \frac{\int_0^{t_1} I_{meas} dt}{\int_0^{t_1} I_{mod} dt} \quad (19)$$

Analogously hereto, an $SOH_{in}$ can also be defined during a complete battery charge, if the starting point is an empty battery:

$$SOH_{in} = \frac{\int_0^{t_v} I_{meas} dt}{\int_0^{t_v} I_{mod} dt} \quad (20)$$

wherein here it is assumed that the charging process begins at point in time $t_0$ and is finished at point in time $t_v$.

In practice, complete charging and discharging processes are rare (e.g. the battery of an electric car will never be completely emptied, since it would then no longer be able to function). The algorithm must therefore also be capable of being able to determine the SOH with partial charges and discharges. For this, any desired period $[t_1; t_2]$ is defined without a priori knowledge of whether there is a charge, a discharge or both (e.g. one or more full cycles or partial cycles) in this period. The period $[t_1; t_2]$ typically lies in the region of hours; the more accurate requirements are indicated further below. Within the period, the SOH can be calculated as $$SOH_{out} = \frac{\int_{t_1}^{t_2} I_{meas,out} dt}{\int_{t_1}^{t_2} I_{mod,out} dt} \quad (21)$$

and $$SOH_{in} = \frac{\int_{t_1}^{t_2} I_{meas,in} dt}{\int_{t_1}^{t_2} I_{mod,in} dt}, \quad (22)$$

wherein the indices "out" and "in" in the case of the currents denote a discharge (out) or a charge (in), respectively, of the battery. In these equations $$I_{meas,in} = \begin{cases} |I_{meas}| & \text{for } I_{meas} < 0 \\ 0 & \text{for } I_{meas} \geq 0 \end{cases} \quad (23)$$

$$I_{meas,out} = \begin{cases} 0 & \text{for } I_{meas} < 0 \\ |I_{meas}| & \text{for } I_{meas} \geq 0 \end{cases} \quad (24)$$

and $$I_{mod,in} = \begin{cases} |I_{mod}| & \text{for } I_{mod} < 0 \\ 0 & \text{for } I_{mod} \geq 0 \end{cases} \quad (23)$$

$$I_{mod,out} = \begin{cases} 0 & \text{for } I_{mod} < 0 \\ |I_{mod}| & \text{for } I_{mod} \geq 0 \end{cases} \quad (24)$$

Therefore, in equation (21) integration only takes place in the case of a discharge, in equation (22) only in the case of a charge. In principle, each of these SOH values, i.e. $SOH_{out}$ or $SOH_{in}$, could already serve as approximate value for the actual SOH. However, an increase in accuracy can be achieved through the formation of an average value in accordance with the relationship $$SOH = \frac{SOH_{out} + SOH_{in}}{2} \quad (25)$$

The period $[t_1; t_2]$ is initially arbitrary; however, the choice of the period influences the accuracy of the method. In a specific implementation of the method, this period can preferably be chosen taking into consideration the following conditions:
- The charge amounts discharged and charged during the period must be larger than a predefined threshold value $Q_s$ (e.g. $C_N$ or a multiple of $C_N$).
- At the start and end of the period, in each case the same state of charge $SOC_{ref}$ prevails (e.g. 50%).
- At the start and end of the period, the same current direction prevails (e.g. the battery is being charged).
- Different, overlapping periods can also be used for the two variables $SOH_{out}$ and $SOH_{in}$. This is used, for example, in the implementation of the method represented in the following.

This method has the advantage that, unlike in the case of conventional methods, neither the experimental carrying out of full cycles nor an algorithm is necessary for counting cycles.

In a specific implementation as program code capable of running on a microcontroller, the algorithm can be formed such that it determines, and in each case stores, four coulomb counters ($Q_{out,meas}$, $Q_{out,mod}$, $Q_{in,mod}$, $Q_{in,mod}$) and two SOH values ($SOH_{out}$, $SOH_{in}$). The algorithm is periodically retrieved after a period $\Delta t$, this period is ideally the same as in the case of the SOC calculation. The value for $I_{mod}$ is obtained in each case from the SOC algorithm. The following logic is then executed:

1. Coulomb Counters

Is $I_{mod} < 0$ (discharge)?     (a)

Yes: $Q_{out,mod} = Q_{out,mod} - I_{mod} \cdot \Delta t$

Is $I_{mod} > 0$ (discharge)?     (b)

Yes: $Q_{in,mod} = Q_{in,mod} + I_{mod} \cdot \Delta t$

Is $I_{meas} < 0$ (discharge)?     (c)

Yes: $Q_{out,meas} = Q_{out,meas} - I_{meas} \cdot \Delta t$

Is $I_{meas} > 0$ (discharge)?     (d)

Yes: $Q_{in,meas} = Q_{in,meas} + I_{meas} \cdot \Delta t$

2. SOH Calculation

Are $Q_{out,mod} > Q_s$ and $Q_{out,meas} > Q_s$ and $SOC_{mod} =$   (a)

$SOC_{ref}$ and is the battery discharging?

Yes: $SOH_{out} = \dfrac{Q_{out,neas}}{Q_{out,mod}}$

Reset $Q_{out,meas}$ and $Q_{out,mod}$ to zero.

Are $Q_{in,mod} > Q_s$ and $Q_{in,meas} > Q_s$ and $SOC_{mod} =$   (b)

$SOC_{ref}$ and is the battery charging?

Yes: $SOH_{in} = \dfrac{Q_{in,neas}}{Q_{in,mod}}$

Reset $Q_{in,meas}$ and $Q_{in,mod}$ to zero.

$$SOH = \frac{SOH_{out} + SOH_{in}}{2} \quad (c)$$

The SOH value calculated last is returned by the algorithm and can be displayed e.g. to the user. The parameters $Q_s$ and $SOC_{ref}$ influence the performance of the SOH diagnostics; in the examples shown below, $Q_s = C_N$ and $SOC_{ref} = 50\%$ were used.

The method is demonstrated in the following with reference to a lithium-ion battery cell with NMC/graphite chemistry (representative of the field of application of electromobility). For this, freely available experimental data from Birkl (loc. cit.) are used. Model A ("simple model") is used.

The experiments of Birkl (loc. cit.) were carried out as follows: the battery being tested was subjected to a large number of successive cycles until the operating life of the battery was reached, wherein in each cycle the battery was charged with the CCCV (constant current, constant voltage) method and discharged using a dynamic load profile which simulates a driving cycle in a town. After each 100 cycles, a measurement cycle was carried out to characterize the battery properties, wherein the battery or a battery cell was discharged with a constant current of 0.74 A to an end voltage of 2.7 V and recharged to an end voltage of 4.2 V. This characterization process was repeated approximately 80 times. However, only the full discharge/charge cycles of the characterization cycles are published. These were combined for the present demonstration and thus represent an accelerated ageing behaviour. At the same time, a further strength of the novel method is thus demonstrated, namely the capacity to be able to access the battery operation at any desired point in time and also to be able to manage with incomplete data.

FIG. 6 shows the measured and calculated variables, respectively, for the method using the simple model (model A), namely in FIG. 6a the measured voltage and in FIG. 6b the measured $I_{meas}$ current (curve (a)) and calculated $I_{mod}$ current (output variable of the model, input variable for the SOH algorithm; curve (b)) of the battery. The recognizable difference between model and measurement is a consequence of still-present shortcomings in the model used. Nevertheless, meaningful results can be obtained, as is represented in the following.

FIG. 7 shows the state of charge SOC for this battery (curves (b)) determined according to the novel method (in the specific design according to equation (7)). An SOC value is also shown, which was determined according to conventional methods based on coulomb counting (scaled to the fully discharged cell) (curves (a)). FIG. 7a shows the first hours of the cycling. The novel method can determine the SOC with very good accuracy (compared with the conventional method). FIG. 7b shows the final hours of the cycling. Here, the cell is already significantly aged, i.e. has lost capacity. The novel method can reliably reproduce the full cycling. However, the conventional method fails because of the ageing of the cell: in spite of charging to the end-of-charge voltage, the SOC in the conventional method only reaches an (incorrect) value of approximately 75%. This comparison demonstrates the robustness of the novel method for SOC determination with respect to capacity loss through cell ageing.

The result of the SOH determination is represented in FIG. 8 (curve (b)). A comparison with values from a simple coulomb counting according to equation (19) is also represented (curve (v)). The correspondence is very good. It follows from these results that the SOH can be reliably determined with the novel method.

In the following, the method is demonstrated with reference to a lithium-ion battery cell with LFP/graphite chemistry (representative for the field of application of stationary storage means), wherein model B ("equivalent circuit model") is used for this.

For the experiments, over 670 consecutive charge/discharge cycles were carried out, wherein the discharging was effected with a constant current of 150 A and the charging was effected with the CCCV charging method. The end-of-discharge voltage was 2.85 V and the end-of-charge voltage was 3.8 V. The duration of the test was approx. 1,500 h. The capacity of the new cell $C_N$ was 158 Ah. With this dataset, both the SOC determination (during any desired single cycle) and the SOH determination (over the entire duration of the test) can be demonstrated. In addition, using a suitable measurement technique, highly precise values for SOC and SOH were determined according to the conventional method of coulomb counting, which are used for comparison with the novel method.

FIG. 9 shows the input variables for the method, i.e. the measured voltage $U_{meas}$ (FIG. 9a) and the measured current $I_{meas}$ (FIG. 9b; curve (a)) for this battery. FIG. 9b also shows the modelled current $I_{mod}$ (output variable of the model and input variable for the SOH algorithm; curve (b)). The recognizable difference between model and measurement is a consequence of still-present shortcomings in the model used.

The result of the method, the state of charge SOC and the state of health SOH of the battery, is represented in FIG. 10 (curves (b)). For comparison, values are also represented which result from the precise comparison measurement (curves (v)).

Figure 10A:
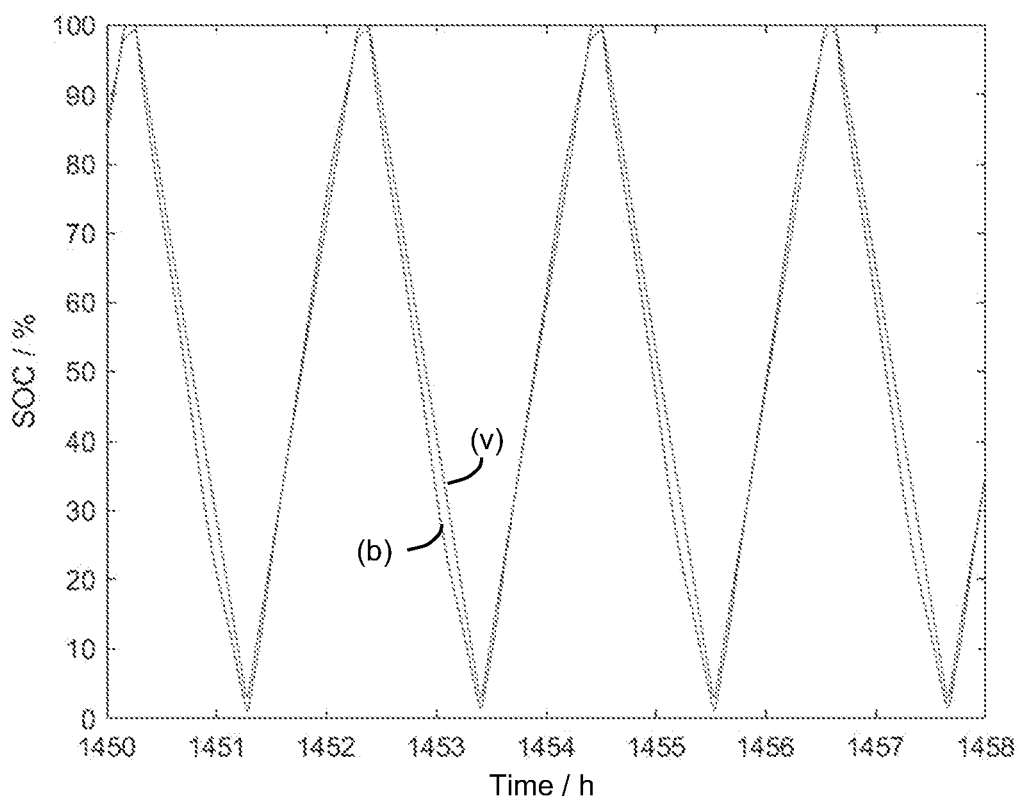
Figure 10B:
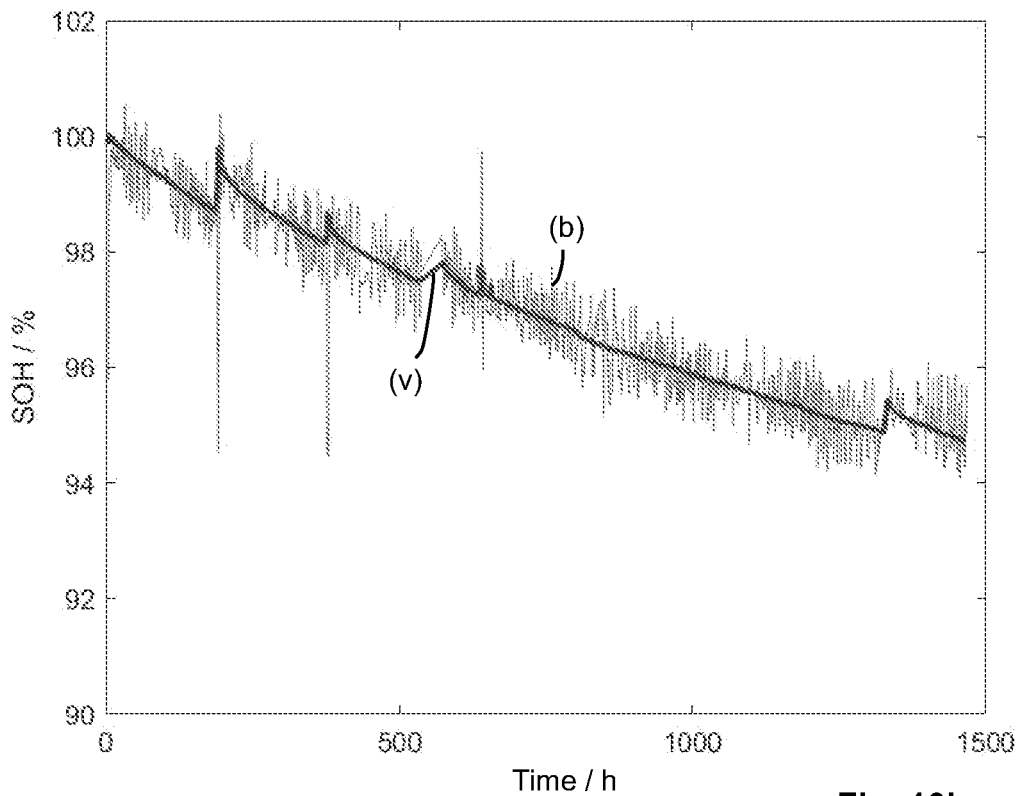

FIG. 10a shows the SOC. The novel method can reliably reflect the cycling of the battery between 0% and 100% SOC, albeit with a certain small error compared with the precise measurement. FIG. 10b shows the SOH. The novel method is capable of reliably reflecting the capacity loss of the battery over the duration of the test of approx. 1,500 hours. Compared with the precise measurement, only an increased noise becomes apparent.

These results prove the ability of the above-described method to function for determining the state of charge and the state of health of batteries.

LIST OF IMPORTANT NAMES OF VARIABLES AND PARAMETERS

C capacity of the battery
$C_N$ nominal capacity of the battery
$I_{meas}$ measured battery current
$I_{mod}$ model battery current
Q remaining charge in the battery
SOC actual state of charge
$SOC_{mod}$ state of charge according to the battery model
SOH actual state of health
$SOH_{mod}$ state of health according to the battery model
t time
$T_{meas}$ measured temperature of the battery
$T_{meas}^{amb}$ measured ambient temperature
$U_{meas}$ measured battery voltage
$U_{mod}$ model battery voltage
$U^0$ open circuit voltage
$\Delta t$ sampling interval

LIST OF REFERENCE NUMBERS 100 overall algorithm
102 first component of the overall algorithm
104 second component of the overall algorithm
106 battery
108 device for carrying out the method
110 unit for voltage measurement
112 unit for current measurement
114 load
116 display unit
118 arithmetic unit

The invention claimed is:

1. A method for determining the state of charge of a rechargeable battery, or a parameter physically related thereto, in particular a remaining charge amount Q contained in the battery, wherein the method comprises the following steps:

(a) creating a voltage-controlled dynamic mathematical battery model for the battery or a specified battery type of the battery,
   (i) which links a state of charge of the battery $SOC_{mod}$, or the parameter physically related thereto, to a battery current $I_{mod}$, and
   (ii) which defines a voltage $U_{meas}$ measured between the two poles of the battery as a function of a sum of an open circuit voltage $U^0$ of the battery and an overvoltage η,
   (iii) wherein the open circuit voltage $U^0$ depends at least on the remaining charge amount Q, or the parameter physically related thereto, and the overvoltage η depends at least on the battery current $I_{mod}$; and
   (iv) wherein the voltage-controlled dynamic mathematical battery model consists of or is developed from an implicit system of equations which comprises the following equations:

$$\frac{dSOC_{mod}}{dt} = -\frac{I_{mod}}{C_N} \quad (1)$$

$$U_{meas} = U^0(SOC_{mod}, T_{meas}, t) + \eta(I_{mod}, SOC_{mod}, T_{meas}, t) \quad (2)$$

wherein $C_N$ denotes a specified nominal capacity of the battery, $T_{meas}$ a measured temperature of the battery and t the time, wherein the open circuit voltage $U^0$ necessarily exhibits a dependence on the state of charge $SOC_{mod}$, whereas the dependence on the measured temperature $T_{meas}$ and the time t is optional, and wherein the overvoltage η necessarily exhibits a dependence on the battery current $I_{mod}$, whereas the dependence on the state of charge $SOC_{mod}$ and the time t is optional (b) parameterizing the voltage-controlled dynamic mathematical battery model for the battery or the specified battery type; and (c) determining an approximate value $SOC_{mod}$ for the actual state of charge SOC of the battery, or the parameter physically related thereto, by measuring the battery voltage $U_{meas}$ and calculating the approximate value $SOC_{mod}$ using the parameterized voltage-controlled dynamic mathematical battery model.

2. The method according to claim 1, characterized in that the open circuit voltage $U^0$ is assumed to be exclusively dependent on the state of charge $SOC_{mod}$, in that the battery is assumed to have a constant internal resistance $R_i$ and in that the battery model is assumed to be temperature-independent, with the result that the battery model is defined by the following equations:

$$\frac{dSOC_{mod}}{dt} = -\frac{I_{mod}}{C_N} \qquad (a)$$

$$U_{meas} = U^0(SOC_{mod}) - R_i \cdot I_{mod}, \qquad (b)$$

wherein the dependence of the open circuit voltage $U^0$ on the state of charge $SOC_{mod}$ is determined in particular by measurement, in particular as measured discrete values or as an analytical function.

3. The method according to claim 2, characterized in that both equations are solved by analytical inversion, wherein the state of charge $SOC_{mod}$ is calculated from the equations $$\frac{dSOC_{mod}}{dt} = -\frac{1}{R_i \cdot C_N} \cdot (U^0(SOC_{mod}) - U_{meas})$$

$$I_{mod} = \frac{1}{R_i}(U^0(SOC_{mod}) - U_{meas}).$$

4. The method according to claim 3, characterized in that the voltage $U_{meas}$ is captured in the form of discrete measured voltage values $U_{meas}^i$ at a specified interval $\Delta t$ or at specified points in time and in that the approximate value $SOC_{mod}$ for the state of charge is calculated by discretization of the equation according to claim 3 using a mathematical discretization method, in particular using the explicit forward Euler method, from the equation $$SOC_{mod}^{i+1} = SOC_{mod}^i - \frac{\Delta t}{R_i \cdot C_N} \cdot (U^0(SOC_{mod}^i) - U_{meas}^i)$$

wherein i denotes the index for a time step.

5. The method according to claim 3, characterized in that in addition a linear correlation is assumed between the open circuit voltage $U^0$ and the state of charge $SOC_{mod}$ and in that the state of charge is calculated from the relationships $$\frac{dSOC_{mod}}{dt} = -\frac{1}{R_i \cdot C_N}((U_L - U_E) \cdot SOC_{mod} + U_E - U_{meas}) \text{ and}$$

$$I_{mod} = \frac{1}{R_i}((U_L - U_E) \cdot SOC_{mod} + U_E - U_{meas}),$$

wherein $U_L$ denotes an end-of-charge voltage and $U_E$ an end-of-discharge voltage.

6. The method according to claim 5, characterized in that the voltage $U_{meas}$ is captured in the form of discrete measured voltage values $U_{meas}^i$ at a specified interval $\Delta t$ and in that the approximate value $SOC_{mod}$ for the state of charge is calculated by discretization of the equations according to claim 5 using a mathematical discretization method, in particular using the implicit backward Euler method, from the equations $$I_{model}^{i+1} = \frac{1}{\frac{(U_L - U_E)}{C_N}\Delta t + R_i}\left((U_L - U_E) \cdot SOC_{model}^i + U_E - U_{measurement}^{i+1}\right)$$

$$SOC_{model}^{i+1} = SOC_{model}^i - \frac{I_{model}^{i+1}}{C_N}\Delta t$$

wherein i denotes the index for a time step.

7. The method according to claim 1, characterized in that,
(a) as mathematical battery model, an equivalent circuit model is used, which is described by the equations according to features (a) (iv) (1) and (a)(iv)(2) of claim 1, wherein the equation according to feature (a)(iv)(2) of claim 1 is replaced by the system of equations:

$$U_{meas} = \qquad (i)$$
$$U^0(SOC_{meas}, T_{mod}) + \Delta U_{hys}(I_{mod}) - U_{RC,an} - U_{RC,ca} - I_{mod} \cdot R_s(T_{mod})$$

$$\frac{dU_{RC,an}}{dt} = \frac{1}{C_{DL,an}(T_{mod})}\left(I_{mod} - \frac{U_{RC,an}}{R_{CT,an}(T_{mod})}\right) \qquad (ii)$$

$$\frac{dU_{RC,ca}}{dt} = \frac{1}{C_{DL,ca}(T_{mod})}\left(I_{mod} - \frac{U_{RC,ca}}{R_{CT,ca}(T_{mod}, I_{mod})}\right) \qquad (iii)$$

$$\frac{dT_{mod}}{dL} = \frac{1}{C_{th}}\left(I_{mod}^2 R_s(T_{mod}) + \frac{U_{RC,an}^2}{R_{CT,an}(T_{mod})} + \frac{U_{RC,ca}^2}{R_{CT,ca}(T_{mod}, I_{mod})} - \frac{T_{mod} - T_{meas}^{amb}}{R_{th}} + I_{mod} \cdot (T_{mod} - T^0) \cdot \frac{dU^0(SOC_{mod})}{dT}\right) \qquad (iv)$$

wherein $U_{RC}$ denotes a voltage drop across an RC element, $R_{CT}$ a charge transfer resistance, $C_{DL}$ a double-layer capacitance, $C_{th}$ a thermal capacity, $R_{th}$ a thermal transfer resistance at the battery surface, $dU^0(SOC_{mod})/dT$ a temperature dependence of the open circuit voltage, $T^0$ an associated reference temperature and $T_{meas}^{amb}$ a measured ambient temperature of the battery, wherein the indices "an" and "ca" refer to an anode and a cathode of the battery and wherein an asymmetry of the open circuit voltage $U^0$ is described by $\Delta U_{hys}$ and an asymmetry of the cathode resistance is described by a current dependence on $R_{CT,ca}$, and
(b) in that the value for the state of charge $SOC_{mod}$ is calculated from this system of equations, preferably by means of one or more numerical mathematical methods.

8. A device for carrying out the method according to claim 1, with a unit for measuring the battery voltage $U_{meas}$, preferably at equidistant intervals $\Delta t$ or at specified points in time, and with a unit for calculating an approximate value $SOC_{mod}$ for the actual state of charge SOC of the battery, which is formed for carrying out the method according to claim 1.

9. A method for determining the state of health of a rechargeable battery of a specified battery type, or a parameter physically related thereto, in particular a present capacity C of the battery, which comprises the following steps:
(a) creating a voltage-controlled dynamic mathematical battery model for the battery or a specified battery type of the battery,
(i) which links a state of charge of the battery $SOC_{mod}$, or the parameter physically related thereto, to a battery current $I_{mod}$, and (ii) which defines a voltage $U_{meas}$ measured between the two poles of the battery as a function of a sum of an open circuit voltage $U^0$ of the battery and an overvoltage η, (iii) wherein the open circuit voltage $U^0$ depends at least on the remaining charge amount Q, or the parameter physically related thereto, and the overvoltage η depends at least on the battery current $I_{mod}$; and (iv) wherein the voltage-controlled dynamic mathematical battery model consists of or is developed from an implicit system of equations which comprises the following equations:

$$\frac{dSOC_{mod}}{dt} = -\frac{I_{mod}}{C} \quad (1)$$

$$U_{meas} = U^0(SOC_{mod}, T_{meas}, t) + \eta(I_{mod}, SOC_{mod}, T_{meas}, t) \quad (2)$$

wherein $C_N$ denotes a specified nominal capacity of the battery, $T_{meas}$ a measured temperature of the battery and t the time, wherein the open circuit voltage $U^0$ necessarily exhibits a dependence on the state of charge $SOC_{mod}$, whereas the dependence on the measured temperature $T_{meas}$ and the time t is optional, and wherein the overvoltage η necessarily exhibits a dependence on the battery current $I_{mod}$, whereas the dependence on the state of charge $SOC_{mod}$ and the time t is optional;

(b) parameterizing the voltage-controlled dynamic mathematical battery model for the battery or the specified battery type;

(c) determining a charge amount $Q_{in,meas}$ received by the battery during a first observation period and/or a charge amount $Q_{out,meas}$ provided by the battery during a second observation period by measuring and integrating a battery current $I_{meas}$ provided or received by the battery, wherein the second observation period is preferably chosen to be identical to or at least overlapping the first observation period;

(d) calculating a charge amount $Q_{in,mod}$ received by the battery during the first observation period and a charge amount $Q_{out,mod}$ provided by the battery during the second observation period using a voltage-controlled dynamic mathematical battery model parameterized for the battery or the specified battery type; and (e) determining an approximate value $SOH_{mod}$ for the actual state of health SOH by calculating a charge state of health $SOH_{in}$ as a quotient of the charge amount $Q_{in,meas}$ and the charge amount $Q_{in,mod}$ and/or a discharge state of health $SOH_{out}$ as a quotient of the charge amount $Q_{out,meas}$ and the charge amount $Q_{out,mod}$ and using the charge state of health $SOH_{in}$ or the discharge state of health $SOH_{out}$ or an average value calculated herefrom as approximate value $SOH_{mod}$ for the actual state of health SOH.

10. The method according to claim 9, characterized in that the first and the second periods are chosen such that the charge amounts $Q_{in,meas}$ charged and/or the charge amounts $Q_{out,meas}$ discharged during the period in question and/or the sum of these amounts are greater than a value predefined in each case, wherein the predefined value is preferably greater than the nominal capacity $C_N$ of the battery.

11. The method according to claim 9, characterized in that the end points of the first and second periods are chosen such that the same state of charge $SOC_{ref}$ exists at the end points as at the start points and/or that the same current direction of the measured battery current $I_{meas}$ prevails at the end points as at the start points.

12. The method according to claim 9, characterized in that the charge amounts $Q_{in,mod}$ and $Q_{out,mod}$ are calculated by integrating the battery current $I_{mod}$ calculated from the voltage-controlled dynamic mathematical battery model.

13. The method according to claim 9, characterized in that the open circuit voltage $U^0$ is assumed to be exclusively dependent on the state of charge $SOC_{mod}$, in that the battery is assumed to have a constant internal resistance $R_i$, in that the battery model is assumed to be temperature-independent, and in that the battery current $I_{mod}$ is calculated from the equation obtained by analytical inversion:

$$I_{mod} = \frac{1}{R_i}\left(U^0(SOC_{mod}) - U_{meas}\right)$$

wherein the dependence of the open circuit voltage $U^0$ on the state of charge $SOC_{mod}$ is determined in particular by measurement, in particular as measured discrete values or as an analytical function.

14. The method according to claim 13, characterized in that the voltage $U_{meas}$ is captured in the form of discrete measured voltage values $U_{meas}$ at a specified interval Δt and in that the battery current $I_{meas}$ is calculated by discretization of the equation according to claim 13 using a mathematical discretization method, in particular using the explicit forward Euler method, from the equation $$I_{mod}^i = \frac{1}{R_i}\left(U^0(SOC_{mod}^i) - U_{meas}^i\right)$$

wherein i denotes the index for a time step.

15. The method according to claim 13, characterized in that in addition a linear correlation is assumed between the open circuit voltage $U^0$ and the state of charge $SOC_{mod}$ and in that the battery current is calculated from the relationships $$\frac{dSOC_{mod}}{dt} = -\frac{1}{R_i \cdot C_N}((U_L - U_E) \cdot SOC_{mod} + U_E - U_{meas}) \text{ and}$$

$$I_{mod} = \frac{1}{R_i}((U_L - U_E) \cdot SOC_{mod} + U_E - U_{meas}),$$

wherein $U_L$ denotes an end-of-charge voltage and $U_E$ an end-of-discharge voltage.

16. The method according to claim 15, characterized in that the voltage $U_{meas}$ is captured in the form of discrete measured voltage values $U_{meas}$ at a specified interval Δt or at specified points in time and in that the approximate value $SOC_{mod}$ for the state of charge is calculated by discretization of the equation according to claim 15 using a mathematical discretization method, in particular using the implicit backward Euler method, from the equations $$I_{mod}^{i+1} = \frac{1}{\frac{(U_L - U_E)}{C_N}\Delta t + R_i}((U_L - U_E) \cdot SOC_{mod}^i + U_E - U_{meas}^{i+1}) \text{ and}$$

$$SOC_{mod}^{i+1} = SOC_{mod}^{i} - \frac{I_{mod}^{i+1}}{C_N} \Delta t$$

wherein i denotes the index for a time step.

17. The method according to claim 9, characterized in that,
(a) as mathematical battery model, an equivalent circuit model is used, which is described by the equations according to features (a) and (b) of claim 13, wherein the equation according to feature (b) of claim 13 is replaced by the system of equations:

$$U_{meas} = \quad \text{(i)}$$
$$U^0(SOC_{meas}, T_{mod}) + \Delta U_{hys}(I_{mod}) - U_{RC,an} - U_{RC,ca} - I_{mod} \cdot R_s(T_{mod})$$

$$\frac{dU_{RC,an}}{dt} = \frac{1}{C_{DL,an}(T_{mod})} \left( I_{mod} - \frac{U_{RC,an}}{R_{CT,an}(T_{mod})} \right) \quad \text{(ii)}$$

$$\frac{dU_{RC,ca}}{dt} = \frac{1}{C_{DL,ca}(T_{mod})} \left( I_{mod} - \frac{U_{RC,ca}}{R_{CT,ca}(T_{mod}, I_{mod})} \right) \quad \text{(iii)}$$

$$\frac{dT_{mod}}{dL} = \frac{1}{C_{th}} \left( I_{mod}^2 R_s(T_{mod}) + \frac{U_{RC,an}^2}{R_{CT,an}(T_{mod})} + \frac{U_{RC,ca}^2}{R_{CT,ca}(T_{mod}, I_{mod})} - \frac{T_{mod} - T_{meas}^{amb}}{R_{th}} + I_{mod} \cdot (T_{mod} - T^0) \cdot \frac{dU^0(SOC_{mod})}{dT} \right) \quad \text{(iv)}$$

wherein $U_{RC}$ denotes a voltage drop across an RC element, $R_{CT}$ a charge transfer resistance, $C_{DL}$ a double-layer capacitance, $C_{th}$ a thermal capacity, $R_{th}$ a thermal transfer resistance at the battery surface, $dU^0(SOC_{mod})/dT$ a temperature dependence of the open circuit voltage, $T^0$ an associated reference temperature and $T_{meas}^{amb}$ a measured ambient temperature of the battery, wherein the indices "an" and "ca" refer to an anode and a cathode of the battery and wherein an asymmetry of the open circuit voltage $U^0$ is described by $\Delta U_{hys}$ and an asymmetry of the cathode resistance is described by a current dependence on $R_{CT,ca}$,
(b) in that the battery current $I_{mod}$ is calculated from this system of equations, preferably by means of one or more numerical mathematical methods and
(c) in that the charge amounts $Q_{in,mod}$ and $Q_{out,mod}$ are calculated by integrating the battery current $I_{mod}$ calculated from the voltage-controlled dynamic mathematical battery model.

18. A device for carrying out the method according to claim 9, with a unit for measuring the battery voltage $U_{meas}$, preferably at equidistant intervals $\Delta t$, with a unit for measuring the battery current $I_{meas}$ and with a unit for calculating an approximate value $SOH_{mod}$ for the actual state of health SOH of the battery, which is formed for carrying out the method according to claim 9.

* * * * *